(12) United States Patent
Guzek et al.

(10) Patent No.: US 9,406,618 B2
(45) Date of Patent: Aug. 2, 2016

(54) DIE-STACKING USING THROUGH-SILICON VIAS ON BUMPLESS BUILD-UP LAYER SUBSTRATES INCLUDING EMBEDDED-DICE, AND PROCESSES OF FORMING SAME

(71) Applicant: Intel Corporation, Santa Clara, CA (US)

(72) Inventors: John S. Guzek, Chandler, AZ (US); Ravi K. Nalla, San Jose, CA (US); Javier Solo Gonzalez, Chandler, AZ (US); Drew Delaney, Chandler, AZ (US); Suresh Pothukuchi, Chandler, AZ (US); Mohit Mamodia, Chandler, AZ (US); Edward Zarbock, Gilbert, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/305,439

(22) Filed: Jun. 16, 2014

(65) Prior Publication Data
US 2014/0295621 A1  Oct. 2, 2014

Related U.S. Application Data

(62) Division of application No. 12/890,082, filed on Sep. 24, 2010, now Pat. No. 8,786,066.

(51) Int. Cl.
*H01L 23/538* (2006.01)
*H01L 23/498* (2006.01)
(Continued)

(52) U.S. Cl.
CPC .......... *H01L 23/5384* (2013.01); *H01L 23/481* (2013.01); *H01L 23/49827* (2013.01); *H01L 23/5389* (2013.01); *H01L 24/24* (2013.01); *H01L 24/73* (2013.01); *H01L 24/82* (2013.01); *H01L 25/03* (2013.01);
(Continued)

(58) Field of Classification Search
CPC .............. H01L 23/538; H01L 23/5383; H01L 23/5384; H01L 23/5385; H01L 23/5389; H01L 23/12; H01L 23/14
See application file for complete search history.

(56) References Cited

U.S. PATENT DOCUMENTS 7,816,181 B1  10/2010  Bhagath et al.
8,080,445 B1  12/2011  Pagaila
(Continued)

FOREIGN PATENT DOCUMENTS

CN  1956183 A  5/2007
CN  101626016 A  1/2010
(Continued)

OTHER PUBLICATIONS

Office Action received for Taiwan Patent Application No. 100134388, mailed on Sep. 16, 2014, 4 Pages of Office Action and 4 Pages of English Translation.
(Continued)

*Primary Examiner* — Michele Fan
(74) *Attorney, Agent, or Firm* — Winkle, PLLC

(57) ABSTRACT

An apparatus includes a coreless substrate with a through-silicon via (TSV) embedded die that is integral to the coreless substrate. The apparatus includes a subsequent die that is coupled to the TSV die and that is disposed above the coreless substrate.

32 Claims, 14 Drawing Sheets

(51) Int. Cl.
*H01L 23/48* (2006.01)
*H01L 23/00* (2006.01)
*H01L 25/03* (2006.01)
*H01L 25/065* (2006.01)
*H01L 25/18* (2006.01)

(52) U.S. Cl.
CPC ...... *H01L 25/0657* (2013.01); *H01L 23/49816* (2013.01); *H01L 24/48* (2013.01); *H01L 25/18* (2013.01); *H01L 2224/16145* (2013.01); *H01L 2224/24226* (2013.01); *H01L 2224/48137* (2013.01); *H01L 2224/48472* (2013.01); *H01L 2224/73259* (2013.01); *H01L 2225/06513* (2013.01); *H01L 2225/06541* (2013.01); *H01L 2924/014* (2013.01); *H01L 2924/01005* (2013.01); *H01L 2924/01006* (2013.01); *H01L 2924/01029* (2013.01); *H01L 2924/01033* (2013.01); *H01L 2924/01057* (2013.01)

(56) References Cited

U.S. PATENT DOCUMENTS

| | | |
|---|---|---|
| 2004/0115867 A1 | 6/2004 | Shibata |
| 2004/0245632 A1 | 12/2004 | Nagarajan |
| 2007/0025092 A1 | 2/2007 | Lee et al. |
| 2007/0289127 A1 | 12/2007 | Hurwitz et al. |
| 2009/0008792 A1 | 1/2009 | Ko et al. |
| 2009/0039527 A1 | 2/2009 | Chan et al. |
| 2009/0189293 A1 | 7/2009 | Suzuki et al. |
| 2010/0008058 A1 | 1/2010 | Saen et al. |
| 2010/0032827 A1 | 2/2010 | Hsu |
| 2010/0081236 A1 | 4/2010 | Yang et al. |
| 2010/0109096 A1 | 5/2010 | Osada et al. |
| 2010/0123241 A1 | 5/2010 | Shi et al. |
| 2010/0148336 A1 | 6/2010 | Do et al. |
| 2010/0237481 A1 | 9/2010 | Chi et al. |
| 2010/0244208 A1 | 9/2010 | Pagaila et al. |
| 2010/0309704 A1 | 12/2010 | Dattaguru et al. |
| 2010/0320601 A1 | 12/2010 | Pagaila et al. |
| 2011/0024888 A1 | 2/2011 | Pagaila et al. |
| 2011/0031634 A1 | 2/2011 | Pagaila |
| 2011/0079923 A1 | 4/2011 | Suh |
| 2011/0108948 A1 | 5/2011 | Kim et al. |
| 2011/0140247 A1 | 6/2011 | Pagaila et al. |
| 2011/0183464 A1 | 7/2011 | Takahashi et al. |
| 2011/0204505 A1 | 8/2011 | Pagaila et al. |
| 2011/0266693 A1 | 11/2011 | Simmons-Matthews |
| 2011/0304349 A1 | 12/2011 | Stillman et al. |
| 2011/0316140 A1* | 12/2011 | Nalla et al. .................... 257/698 |
| 2011/0316147 A1 | 12/2011 | Shih et al. |
| 2012/0012990 A1 | 1/2012 | Pagaila et al. |
| 2012/0056312 A1 | 3/2012 | Pagaila et al. |
| 2012/0056314 A1 | 3/2012 | Pagaila et al. |
| 2012/0056334 A1 | 3/2012 | Yang et al. |

FOREIGN PATENT DOCUMENTS

| | | |
|---|---|---|
| CN | 102077344 A | 5/2011 |
| TW | 201007903 A | 2/2010 |
| TW | M383200 U | 6/2010 |
| TW | 201027706 A | 7/2010 |
| TW | I327345 B | 7/2010 |
| TW | 201034120 A | 9/2010 |
| WO | 2012/040682 A2 | 3/2012 |
| WO | 2012/040682 A3 | 7/2012 |

OTHER PUBLICATIONS

International Preliminary Report on Patentability received for PCT Patent Application No. PCT/US2011/053175,mailed on Apr. 4, 2013, 7 pages.

International Search Report and Written Opinion received for PCT Patent Application No. PCT/US2011/053175, mailed on Apr. 12, 2012, 9 pages.

Office Action received for Chinese Patent Application No. 201180045863.5, mailed on Mar. 25, 2015, 11 pages of Chinese Office Action only.

Office Action received for Chinese Patent Application No. 201180045863.5, mailed on Oct. 27, 2015, 5 Pages of Chinese Office Action only.

Office Action received for Taiwan Patent Application No. 104123086, mailed on Dec. 14, 2015, 6 pages of English Translation and 6 pages of Taiwan Office Action.

* cited by examiner

DIE-STACKING USING THROUGH-SILICON VIAS ON BUMPLESS BUILD-UP LAYER SUBSTRATES INCLUDING EMBEDDED-DICE, AND PROCESSES OF FORMING SAME

RELATED APPLICATION

The present application is a divisional application of prior U.S. application Ser. No. 12/890,082, filed on Sep. 24, 2010, entitled "DIE-STACKING USING THROUGH-SILICON VIAS ON BUMPLESS BUILD-UP LAYER SUBSTRATES INCLUDING EMBEDDED-DICE, AND PROCESSES OF FORMING SAME".

Disclosed embodiments relate to semiconductor microelectronic devices and processes of packaging them.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which:

FIG. 1h is a cross-section elevation of the apparatus depicted in FIG. 1g after further processing;

DETAILED DESCRIPTION

Reference will now be made to the drawings wherein like structures may be provided with like suffix reference designations. In order to show the structures of various embodiments more clearly, the drawings included herein are diagrammatic representations of integrated circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings.

Figure 1:
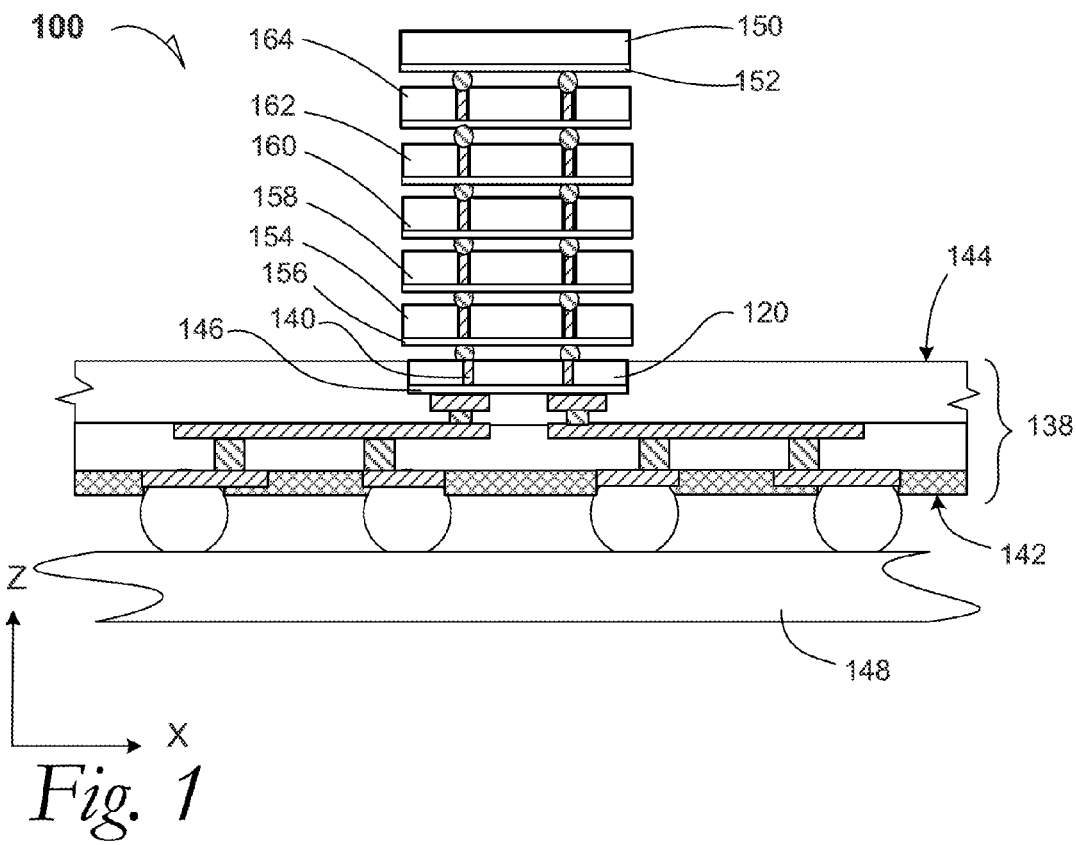
FIG. 1 is a cross-section elevation of a fully embedded die coreless-substrate apparatus according to an example embodiment.

FIG. 1 is a cross-section elevation of a fully embedded die coreless-substrate apparatus 100 according to an example embodiment. A die 120 has been embedded in a coreless substrate 138. The die 120 has at least one through-silicon via 140. Two through-silicon vias are depicted, one of which is enumerated, but the two illustrated through-silicon vias are presented for simplicity. In an embodiment, a total of 10 through-silicon vias are found in the die 120. The die 120 may therefore be referred to as a die including a through-silicon via disposed therein (TSV die 120). The coreless substrate 138 includes a land side 142 and a die side 144. The TSV die 120 also includes an active surface 121 and a backside surface 123 (see FIG. 1h) and it can be seen that the active surface 121 of the TSV die 120 is closer to the die side 144 than to the land side 142. As will be understood to those skilled in the art, the TSV die 120 includes an active portion with integrated circuitry and interconnections (not shown). The TSV die 120 may be any appropriate integrated circuit device including but not limited to a microprocessor (single or multi-core), a memory device, a chipset, a graphics device, an application specific integrated circuit according to several different embodiments.

The TSV die 120 is also illustrated with a metallization 146 in simplified form. The metallization 146 is in contact with the integrated circuitry in the TSV die 120 at the active surface 121. In an embodiment, the metallization 146 has metal-one (M1) to metal-eleven (M11) metallization layers in order to pin out the complexity of the TSV die 110 to the outside world, where M1 is in contact with the integrated circuitry in the TSV die 120. In selected embodiments, any number of metallizations between M1 and M11 are present. In an example embodiment, the TSV die 120 has metallizations from M1 to M7 and M7 is thicker than M1 to M6. Other metallization numbers and thickness combinations may be achieved depending upon a given application utility. The apparatus 100 is mounted to a foundation substrate 148 at the land side 142 according to an embodiment. For example, where the TSV die 120 is part of a hand-held device such as a smart phone embodiment or a hand-held reader embodiment, the foundation substrate 148 is a motherboard. In an example embodiment where the TSV die 120 is part of a hand-held device such as a smart phone embodiment or a hand-held reader embodiment, the foundation substrate 148 is an external shell such as the portion an individual touches during use. In an example embodiment where the TSV die 120 is part of a hand-held device such as a smart phone embodiment or a hand-held reader embodiment, the foundation substrate 148 includes both the motherboard and an external shell such as the portion an individual touches during use.

The apparatus 100 includes a fully embedded TSV die 120. As meant in this disclosure, "fully embedded" means there is no surface of the TSV die 120 that extends (as illustrated in the Z-direction) above the die side 144 of the coreless substrate 138.

In an embodiment, the TSV die 120 is part of a larger apparatus that includes a subsequent die 150 that is disposed above the die side 144 and that is coupled to the TSV die 120 though the at least one TSV 140. The TSV die 120 is referred to as a TSV first die 120. The subsequent die 150 is also illustrated with a metallization 152 in simplified depiction, but it may also have M1 to M11 or any number and top metallization thickness differences that are described for the TSV first die 120.

In an embodiment, the TSV die 120 is part of a larger apparatus where the TSV die is a TSV first die 120, the apparatus 100 further includes a second TSV die 154 that is disposed above the die side 144 and that is in physical contact to the TSV first die 120 at the at least one TSV 140. The TSV second die 154 is also depicted with a metallization 156.

It may now be appreciated that the TSV first die 120 may be complemented with a plurality of TSV dice along with a subsequent die 150. In an embodiment, the TSV die 120 is a TSV first die 120 and three TSV dice are disposed between the TSV first die 120 and the subsequent die 150 such that three dice are stacked above the TSV first die 120 and coupled to the subsequent die 150. In an embodiment, the TSV die 120 is a TSV first die 120 and from four to six TSV dice are disposed between the TSV first die 120 and the subsequent die 150 such that four-to-six dice are stacked above the TSV first die 120 and coupled to the subsequent die 150. In an embodiment, this represents a TSV second die disposed above the die side 144 and in contact to the TSV first die 120, a TSV third die disposed above and in contact to the TSV second die, a TSV fourth die disposed above and in contact to the TSV third die, and the subsequent die 150 disposed above and in contact to the TSV fourth die.

As illustrated in FIG. 1, a TSV first die 120 and a subsequent die 150 are separated by a TSV second die 154, a TSV third die 158, a TSV fourth die 160, a TSV fifth die 162, a TSV sixth die 164, and the subsequent die 150 according to an embodiment. It can now be appreciated that where the TSV first die 120 may be a processor die such as a processor made by Intel Corporation of Santa Clara, Calif., the TSV subsequent die 150 may be a memory die such as a solid-state drive (SSD) die 150. In an embodiment, the TSV subsequent die 150 is a memory die such as a dynamic random-access memory (DRAM) die 150. It may also be appreciated that although the several TSV dice are illustrated with only two TSVs each, the dice closer to the TSV first die 120 may have more TSVs than the penultimate die; in this case the TSV sixth die 164. In an example embodiment, the TSV first die 120 has between 100 and 1,200 TSVs, and the TSV penultimate die 164 has between 100 and 600 TSVs. The several TSV dice disposed between the TSV first die 120 and the TSV penultimate die have a proportionally lesser number of TSVs the closer they are disposed to the subsequent die 150.

As a result of the disclosed TSV die embodiments, the Z-height of the apparatus 100 may be lowered even with several dice stacked. A lowered Z-height is useful for compact apparatus design and usage such as for a hand-held device. Where the several embodiments include a stack of TSV dice and one subsequent die, the overall footprint is reduced where the apparatus may operate as a chipset. This is useful because the stack of dice take up a compact footprint upon the coreless substrate 138.

Figure 1B:
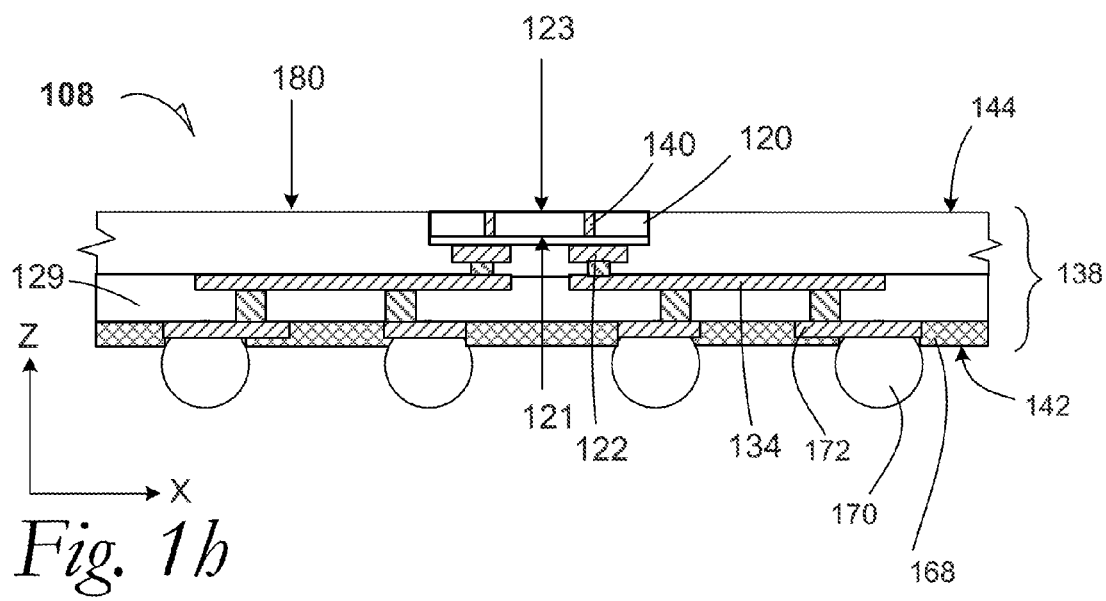
FIG. 1b is a cross-section elevation of the embedded die coreless-substrate apparatus depicted in FIG. 1a during further processing according to an embodiment.
Figure 1A:
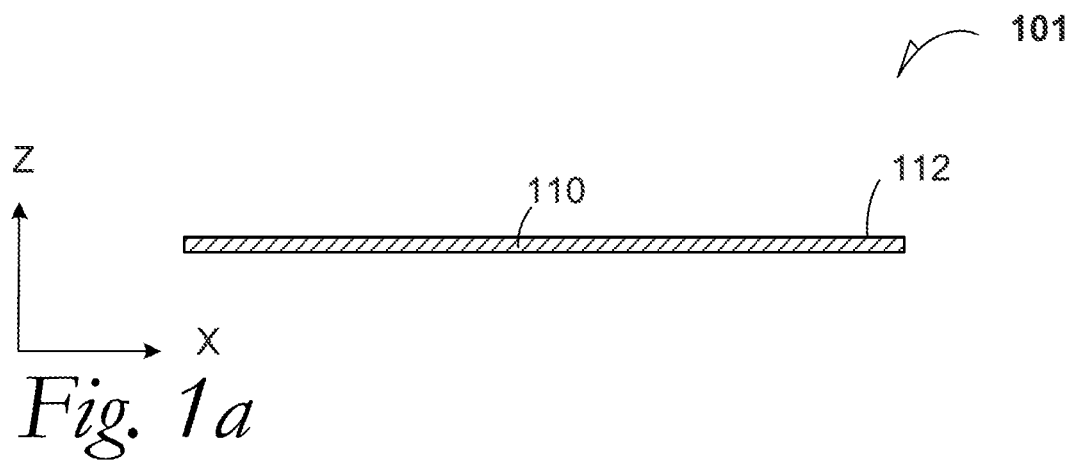
FIG. 1a is a cross-section elevation of a fully embedded die coreless-substrate apparatus during processing according to an example embodiment.
Figure 1B:
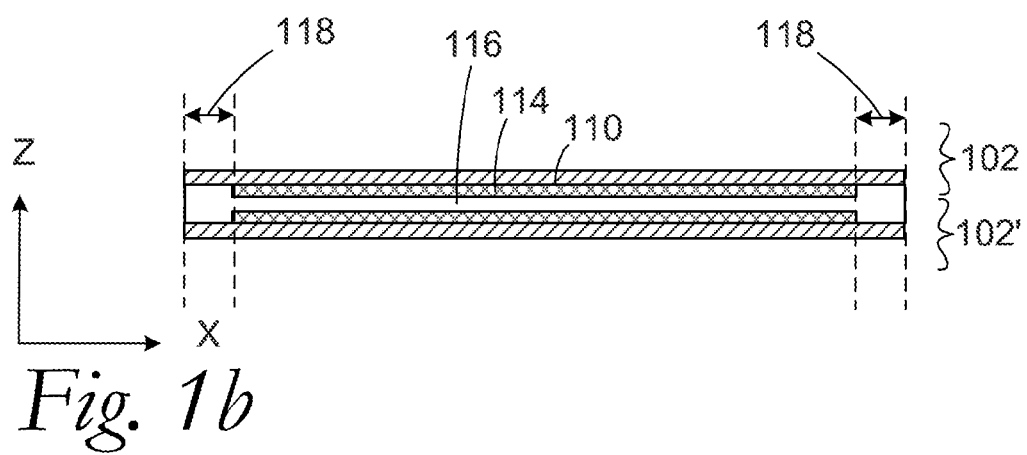

FIG. 1a is a cross-section elevation of a fully embedded die coreless-substrate apparatus 101 during processing according to an example embodiment. The apparatus 101 represents early processing and is related to the apparatus 100 depicted in FIG. 1. An etch-stop layer 110 such as a copper foil 110 is provided with a die-mounting surface 112.

FIG. 1b is a cross-section elevation of the embedded die coreless-substrate apparatus depicted in FIG. 1a during further processing according to an embodiment. During processing, the apparatus 101 may be mated to an identical structure in order to build two-back-to-back apparatus for processing utility. The apparatus 102 has been enlarged by back-to-back mating the original apparatus 102 to a similar apparatus 102'. Consequently, processing throughput is effectively doubled. Description of the apparatus 102 and 102' may be referred to by reference numerals ascribed to the apparatus 102, but it may be understood that duplicate processing and structures are contained in the apparatus 102'.

The apparatus 102 includes an adhesion release layer 114 and an adhesive binder 116. A cutting zone 118 is provided at each end of the apparatus 102 in the X-dimension for separation processing as illustrated further.

Figure 1C:
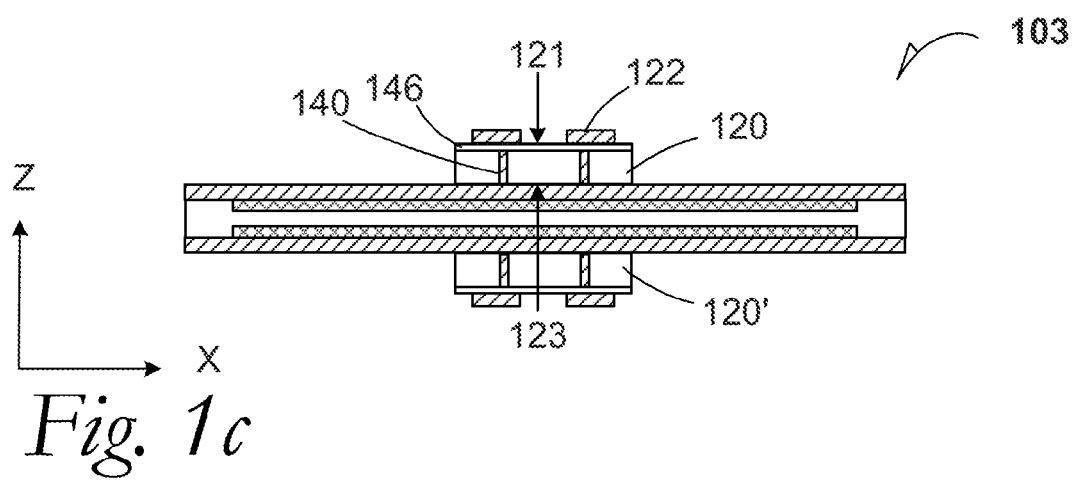
FIG. 1c is a cross-section elevation of the apparatus depicted in FIG. 1b after further processing according to an embodiment.

FIG. 1c is a cross-section elevation of the apparatus depicted in FIG. 1b after further processing according to an embodiment. The apparatus 103 has been further processed by placing a TSV die 120 upon the etch-stop layer 110. In an embodiment, the etch-stop layer 110 is a copper foil. In an embodiment, the etch-stop layer 110 is an organic material. Other materials may be used for the etch-stop layer 110 depending upon a specific application. The TSV die 120 has a plurality of die bond pads, one of which is indicated with a reference numeral 122. The TSV die 120 has an active surface 121 that is on the same surface as the die bond pads 122. The number of die bond pads 122 is show as only two for illustrative simplicity and these die bond pads 122 are not necessarily in contact with the vias 140. The TSV die 120 has a backside surface 123 that is opposite the active surface 121. Further, the TSV die 120 has a metallization 146 that may include any number and comparative thickness metallizations set forth in this disclosure. The TSV die 120 is also depicted with two through-silicon vias, one of which is delineated with the reference numeral 140.

Figure 1D:
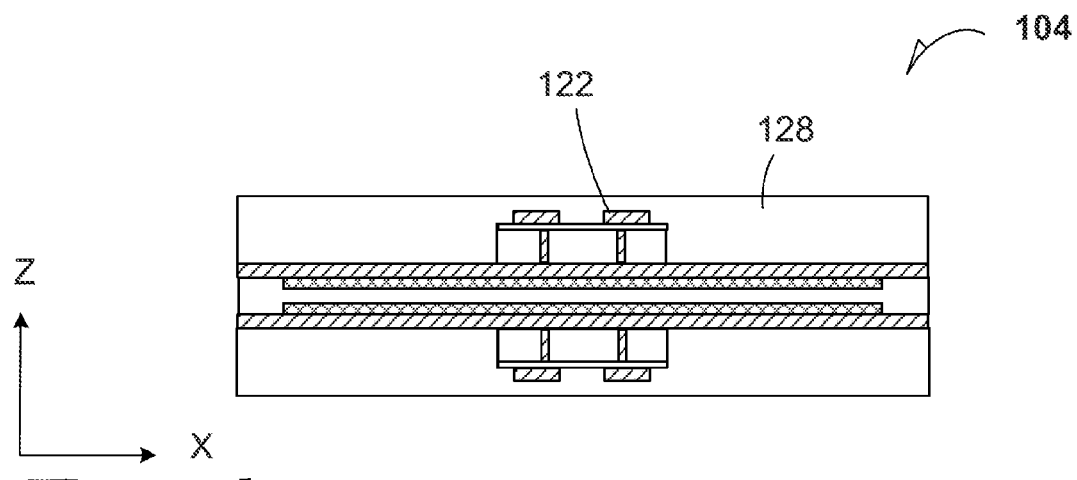
FIG. 1d is a cross-section elevation of the apparatus depicted in FIG. 1c after further processing according to an embodiment.

FIG. 1d is a cross-section elevation of the apparatus depicted in FIG. 1c after further processing according to an embodiment. The apparatus 104 has been processed to receive a first dielectric 128. In an embodiment, the first dielectric 128 is patterned such as by spinning on and curing a dielectric upon a wafer-scale array of apparatus of which the apparatus 104 is merely a subset for illustrative simplicity.

Figure 1E:
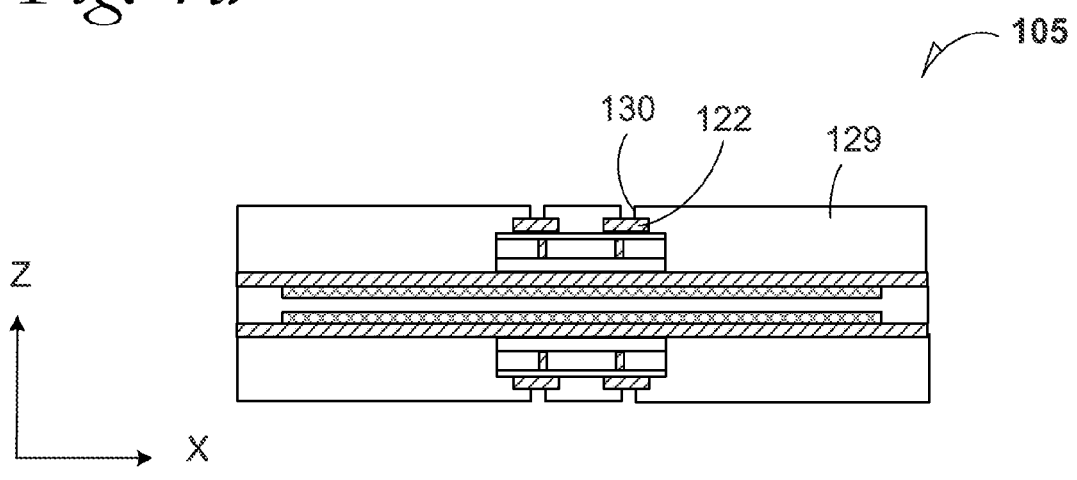
FIG. 1e is a cross-section elevation of the apparatus depicted in FIG. 1d after further processing according to an embodiment.

FIG. 1e is a cross-section elevation of the apparatus depicted in FIG. 1d after further processing according to an embodiment. The apparatus 105 has been processed such that the first dielectric 128, depicted in FIG. 1d, has been patterned to form a patterned first dielectric 129 and several recesses have been formed therein, one of which is indicated with reference numeral 130. The recesses 130 expose the die bond pads 122.

Figure 1F:
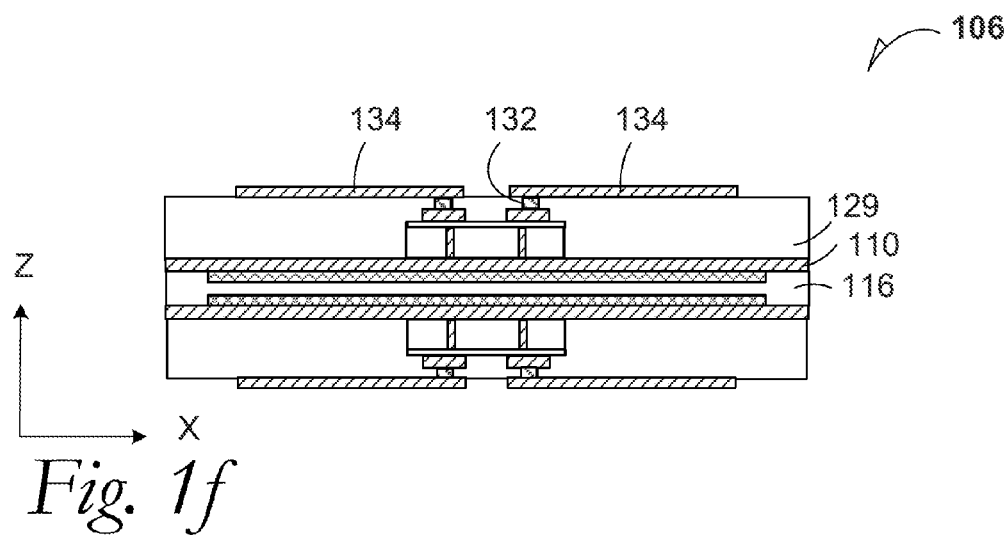
FIG. 1f is a cross-section elevation of the apparatus depicted in FIG. 1e after further processing according to an embodiment.

FIG. 1f is a cross-section elevation of the apparatus depicted in FIG. 1e after further processing according to an embodiment. The apparatus 106 has been processed such that first contacts 132 fill the vias 130 (FIG. 1e) and traces 134 are formed upon the patterned first dielectric 129. In an embodiment, the first contacts 132 are copper and the several die bond pads 122 are also copper. In an embodiment, other metals may be selected for the first contacts 132.

Figure 1G:
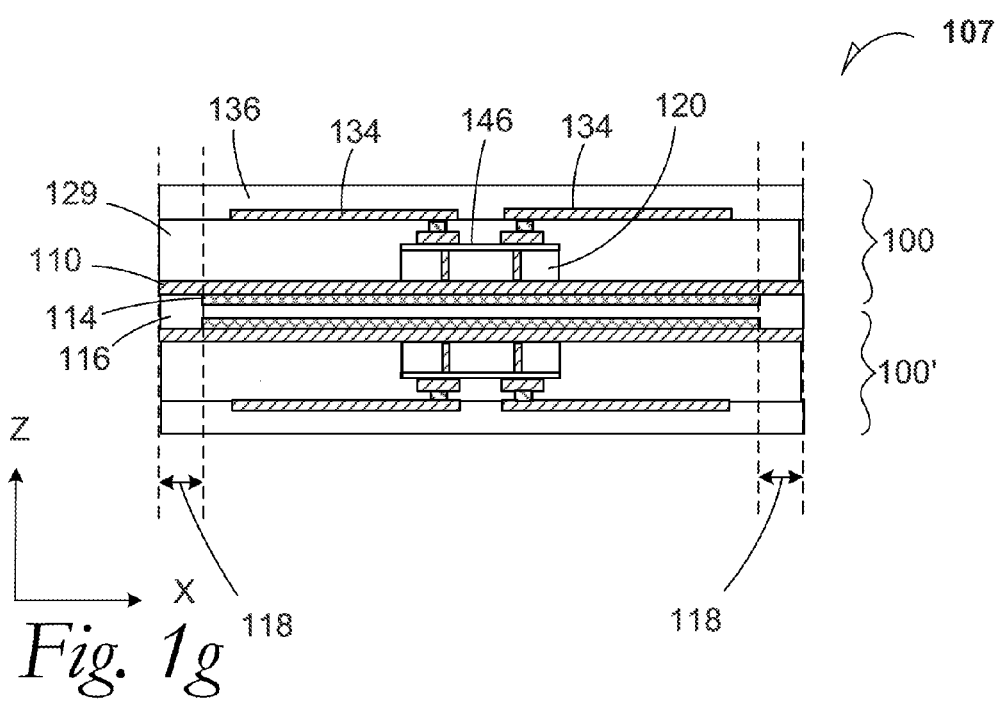
FIG. 1g is a cross-section elevation of the apparatus depicted in FIG. 1f after further processing according to an embodiment.

FIG. 1g is a cross-section elevation of the apparatus depicted in FIG. 1f after further processing according to an embodiment. The apparatus 107 has been processed with a second dielectric 136 such that the patterned first dielectric 129 and the traces 134 are enclosed. Processing of the second dielectric 136 is done by spinning on and curing according to an example embodiment, and it may be done with a wafer-scale array. It may now be appreciated that a bumpless build-up layer (BBUL) is being formed to couple the TSV die 120 to the outside world. Although the BBUL is illustrated with the patterned first dielectric 129 and the second dielectric 136, it may be understood that several layers of metallization and dielectric can be used to form the BBUL, which ultimately is a coreless substrate with an embedded TSV die. Where the disclosed embodiments include BBUL technology on a coreless substrate, the several embodiments may be referred to as BBUL-C embodiments. Further because TSV dice are included the several embodiments may be referred to as TSV-die BBUL-C apparatus.

As configured in FIG. 1g, the two apparatus may be singulated by removing material within the cutting zone 118. With the cutting zone 118 removed, the adhesion release layers 114 allow the two apparatus to be drawn apart.

FIG. 1h is a cross-section elevation of the apparatus depicted in FIG. 1g after further processing. The two back-to-back apparatus have been drawn apart by removing margin materials at the cutting zone 118 (FIG. 1g) as well as the adhesion release layers 114 and the etch-stop layer 110. One of the apparatus 108 is shown with the TSV first die 120 and the at least one TSV 140. The at least one TSV die 140 is exposed through the die side 144 of the coreless substrate and is adjacent to a lateral footprint 180. As depicted, the TSV first die 140 is fully embedded in the coreless substrate 138. A solder mask 168 makes up the material that forms the land side 142 of the coreless substrate 138, and a plurality of electrical bumps, one of which is indicated with numeral 170 is provided. The electrical bumps 170 are used for electrical communication with the foundation substrate 148 (see FIG. 1). The electrical bumps 170 are disposed upon bump bond pads 172. Further processing may result in an apparatus embodiment such as that described and depicted in FIG. 1.

Figure 2:
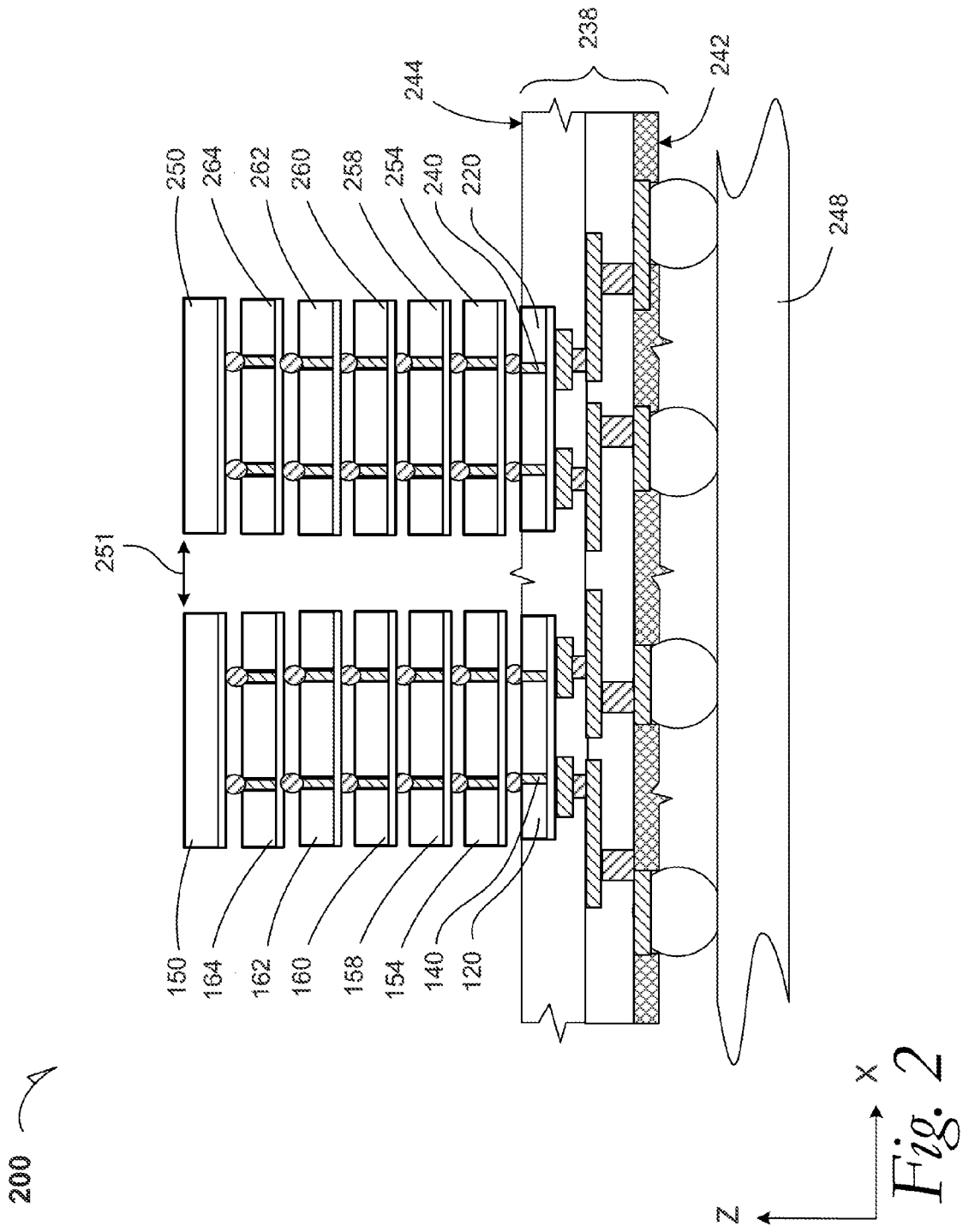
FIG. 2 is a cross-section elevation of a fully embedded die coreless-substrate apparatus according to an example embodiment.

FIG. 2 is a cross-section elevation of a fully embedded die coreless-substrate apparatus 200 according to an example embodiment. A TSV first die 120 has been embedded in a coreless substrate 238. The TSV first die 120 has at least one through-silicon via 140. Two through-silicon vias are depicted, one of which is enumerated, but the two illustrated through-silicon vias are presented for simplicity. In an embodiment, a total of 10 through-silicon vias are found in the TSV first die 120.

The coreless substrate 238 includes a land side 242 and a die side 244. Other structures of the TSV first die 120 may be recognized by referring to the TSV die 120 in FIG. 1. The apparatus 200 is mounted to a foundation substrate 248 at the land side 242 according to an embodiment. The TSV first die 120 is part of a larger apparatus that includes a subsequent die 150 disposed above the die side 244 and that is coupled to the TSV first die 120 though the at least one TSV 140. In an embodiment, the apparatus 200 further includes a TSV second die 154 that is disposed above the die side 244 and that is in physical contact to the TSV first die 120 at the at least one TSV 140. The TSV second die 154 is also depicted with a metallization.

It may now be appreciated that the TSV first die 120 may be complemented with a plurality of TSV dice along with a subsequent die 150. In an embodiment, the TSV die 120 is a TSV first die 120 and three TSV dice are disposed between the TSV first die 120 and the subsequent die 150 such that three dice are stacked above the TSV first die 120 and coupled to the subsequent die 150 to make a total of four dice stacked above the TSV first die 120. In an embodiment, the TSV die 120 is a TSV first die 120 and from four to six TSV dice are disposed between the TSV first die 120 and the subsequent die 150 such that four-to-six dice are stacked above the TSV first die 120 and coupled to the subsequent die 150. In an embodiment, this represents a TSV second die disposed above the die side 144 and in contact to the TSV first die 120, a TSV third die disposed above and in contact to the TSV second die, a TSV fourth die disposed above and in contact to the TSV third die, and the subsequent die 150 disposed above and in contact to the TSV fourth die.

As illustrated in FIG. 2, a TSV first die 120 and a subsequent die 150 are separated by a TSV second die 154, a TSV third die 158, a TSV fourth die 160, a TSV fifth die 162, a TSV sixth die 164, and the subsequent die 150. It can now be appreciated that where the TSV first die 120 may be a processor die such as a processor made by Intel Corporation of Santa Clara, Calif., the TSV subsequent die 150 may be a memory die such as a SSD die 150. It may also be appreciated that although the several TSV dice are illustrated with only two TSVs each, the dice closer to the TSV first die 120 may have more TSVs that the penultimate die; in this case the TSV sixth die 164. In an example embodiment, the TSV first die 120 has between 100 and 1,200 TSVs, and the TSV penultimate die 164 has between 100 and 600 TSVs. The several TSV dice disposed between the TSV first die 120 and the TSV penultimate die have a proportionally lesser number of TSVs the closer they are disposed to the subsequent die 150.

It may now be appreciated that the apparatus 200 may include the TSV first die 120, the subsequent die 150, and from zero to five of the illustrated TSV dice disposed therebetween.

A lateral-stack TSV first die 220 has also been embedded in the coreless substrate 238. The lateral-stack TSV first die 220 has at least one through-silicon via 240. Two through-silicon vias are depicted, one of which is enumerated, but the two illustrated through-silicon vias are presented for simplicity. In an embodiment, a total of 10 through-silicon vias are found in the lateral-stack TSV first die 220.

The lateral-stack TSV first die 220 is part of a larger apparatus that includes a lateral-stack subsequent die 250 that is disposed above the die side 244 and that is coupled to the lateral-stack TSV first die 220 though the at least one TSV 240. In an embodiment, the apparatus 200 further includes a lateral-stack TSV second die 254 that is disposed above the die side 244 and that is in physical contact to the lateral-stack TSV first die 220 at the at least one TSV 240.

It may now be appreciated that the lateral-stack TSV first die 220 may be complemented with a plurality of TSV dice along with the lateral-stack subsequent die 250. In an embodiment, the lateral-stack TSV die 220 is a lateral-stack TSV first die 220 and three lateral-stack TSV dice are disposed between the lateral-stack TSV first die 220 and the lateral-stack subsequent die 250 such that three dice are stacked above the lateral-stack TSV first die 220 and coupled to the lateral-stack subsequent die 250 to make a total of four dice stacked above the lateral-stack TSV first die 220.

In an embodiment, the lateral-stack TSV die 220 is a lateral-stack TSV first die 220 and from four to six lateral-stack TSV dice are disposed between the lateral-stack TSV first die 220 and the lateral-stack subsequent die 250 such that four-to-six dice are stacked above the lateral-stack TSV first die 220 and coupled to the lateral-stack subsequent die 250. In an embodiment, this represents a lateral-stack TSV second die disposed above the die side 244 and in contact to the lateral-stack TSV first die 220, a lateral-stack TSV third die disposed above and in contact to the lateral-stack TSV second die, a lateral-stack TSV fourth die disposed above and in contact to the lateral-stack TSV third die, and the lateral-stack subsequent die 250 disposed above and in contact to the lateral-stack TSV fourth die.

It may now be appreciated that the original lateral-stack TSV first die 220 may have between one and six dice coupled thereto including the lateral-stack subsequent die 250, and the lateral-stack TSV first die 220 also may have between one and six dice coupled thereto including the lateral-stack subsequent die 250. Consequently, the two stacks may be configured with as few as a total of four dice 120, 150, 210, and 250, as many as seven dice in one stack and only two in the lateral stack, and as many as 14 dice.

In an embodiment, the series 100 dice and the series 200 (lateral-stack) dice each have an 8 mm width in the X-direction, spacing 251 is 0.5 mm. Consequently, communication between the series 100 dice and the series 200 dice may be facilitated to have a faster speed than if they were spaced farther apart. It may now also be appreciated that where a first lateral stack of dice is juxtaposed with the TSV first die 120 and at least the subsequent die 150, other lateral-stack TSV dice series may be located in a Y-dimension (into the plane of the drawing). For example, a four-stack apparatus may be formed is substantially a square (rectangular) configuration. Similarly, a three-stack apparatus may be formed in substantially a linear configuration. Other combinations may be formed including a three-stack non-linear configuration. Other combinations may be formed including a six-stack rectangular configuration.

Figure 3:
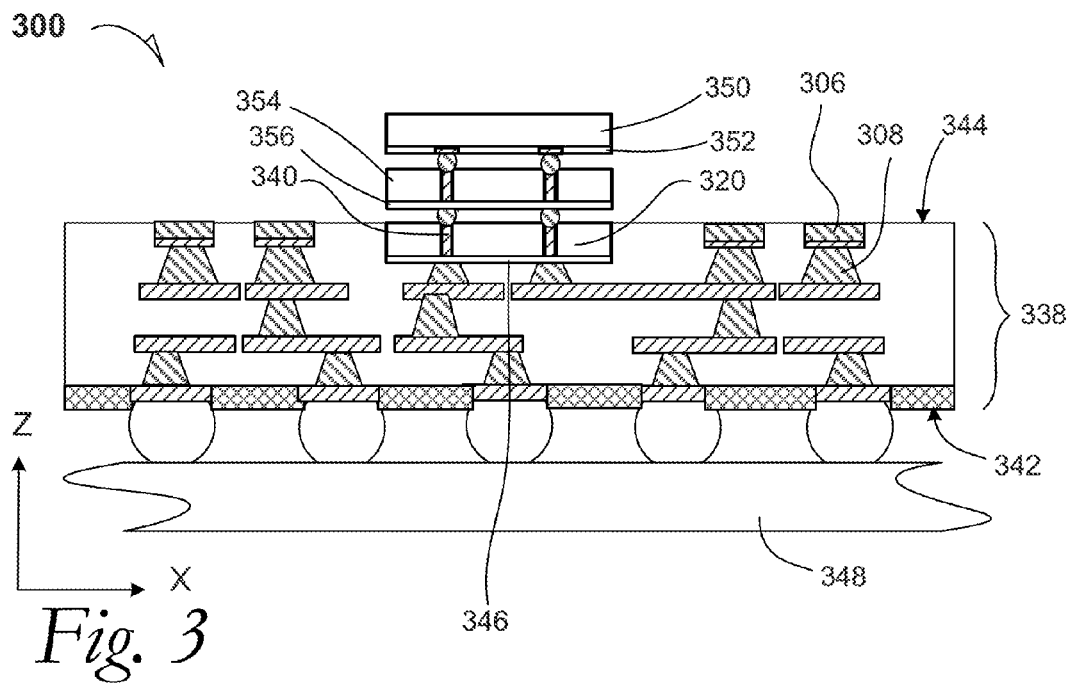
FIG. 3 is a cross-section elevation of a fully embedded through-silicon via die package-on-package coreless-substrate apparatus according to an example embodiment.

FIG. 3 is a cross-section elevation of a fully embedded through-silicon via die package-on-package (POP) coreless-substrate apparatus 300 according to an example embodiment. A TSV die 320 has been embedded in a coreless substrate 338. The TSV die 320 has at least one through-silicon via 340. Two through-silicon vias are depicted, one of which is enumerated, but the two illustrated through-silicon vias are presented for simplicity. In an embodiment, a total of 10 through-silicon vias are found in the TSV die 320. The coreless substrate 338 includes a land side 342 and a die side 344. The TSV die 320 also includes an active surface 321 and a backside surface 323 (see FIG. 3*a*) and it can be seen that the active surface 321 of the TSV die 320 is closer to the die side 344 than to the land side 342.

The TSV die 320 is also illustrated with a metallization 346 in simplified form. In an embodiment, the metallization 346 has M1 to M11 or any other embodiment set forth for the apparatus 100 depicted in FIG. 1. Other metallization numbers and thickness combinations may be achieved depending upon a given application utility.

The apparatus 300 is mounted to a foundation substrate 348 at the land side 342 according to an embodiment. For example, where the TSV die 320 is part of a hand-held device such as a smart phone or a hand-held reader, the foundation substrate 348 is a motherboard. In an example embodiment where the TSV die 320 is part of a hand-held device such as a smart phone or a hand-held reader, the foundation substrate 348 is an external shell such as the portion an individual touches during use. In an example embodiment where the TSV die 320 is part of a hand-held device such as a smart phone or a hand-held reader, the foundation substrate 348 includes both the motherboard and an external shell such as the portion an individual touches during use.

The apparatus 300 includes a fully embedded TSV die 320. The POP coreless substrate 338 includes several POP bond pads on the die side 344, one of which is indicated with the reference numeral 306. The POP bond pads 306 are coupled through the coreless substrate 338 through a series of vias, one of which is indicated with the reference numeral 308. The vias 308 exhibit formation that originated from a direction starting from what is now the land side 342.

In an embodiment, the TSV die 320 is part of a larger apparatus that includes a subsequent die 350 that is disposed above the die side 344 and that is coupled to the TSV die 320 though at least one TSV 340. The TSV die 320 is referred to as a TSV first die 320. The subsequent die 350 is also illustrated with a metallization 352 in simplified depiction, but it may also have M1 to M11 or any number and top metallization thickness differences that are described for the TSV first die 320.

In an embodiment, the TSV die 320 is part of a larger apparatus where the TSV die is a TSV first die 320. The apparatus 300 further includes a TSV second die 354 that is disposed above the die side 344 and that is in physical contact to the TSV first die 320 at the at least one TSV 340. The TSV second die 354 is also depicted with a metallization 356.

It may now be appreciated that the TSV first die 320 may be complemented with a plurality of TSV dice along with a subsequent die 350 similar to any embodiment set forth and illustrated with respect to the apparatus 100 depicted in FIG. 1.

Figure 3A:
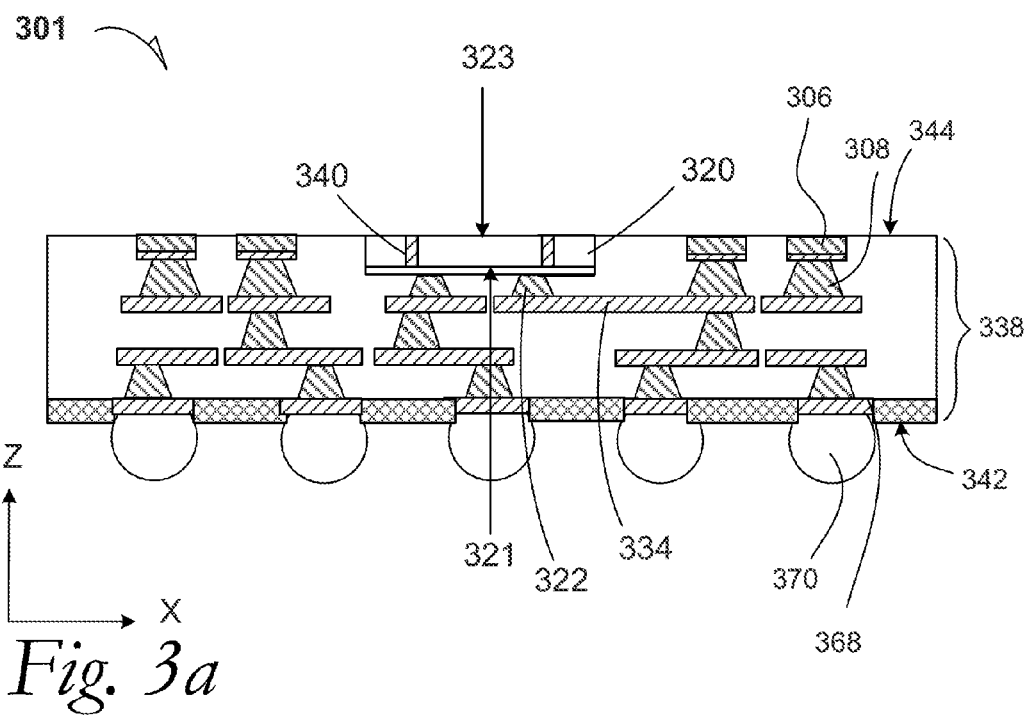
FIG. 3a is a cross-section elevation of the fully embedded die POP coreless-substrate apparatus depicted in FIG. 1 during processing according to an example embodiment.

FIG. 3*a* is a cross-section elevation of the fully embedded die POP coreless-substrate apparatus depicted in FIG. 1 during processing according to an example embodiment. The apparatus 301 represents early processing and is related to the apparatus 300 depicted in FIG. 3. The apparatus 301 is processed to have the POP bond pads 306 emerge on the die side 344. The POP bond pads 306 are coupled through the coreless substrate 338 through the vias 308. It can be seen that the die side 344 as a surface includes a coplanar intersection with the die backside 323. It can also be seen that the POP bond pads 306 also share a coplanar intersection with the die side 344.

The apparatus 301 may also be processed back-to-back with a second coreless substrate and then separated at cutting zone. Processing includes making contact to the die active surface 321 with a die bond pad 322 which may be a filled via 322 in a layer of the coreless substrate 338. The filled via may be manufactured by filling recesses in a layer of the coreless substrate 338 during processing. Structures such as traces 334 are formed upon a patterned portion of a dielectric in the coreless substrate 338. As depicted, the TSV first die 340 is fully embedded in the coreless substrate 338. A solder mask 368 makes up the material that forms the land side 342 of the coreless substrate 338, and a plurality of electrical bumps, one of which is indicated with numeral 370 is provided. The electrical bumps 370 are used for electrical communication with the foundation substrate 348 (see FIG. 3). Further processing may result in an apparatus such as that depicted in FIG. 3.

Figure 4:
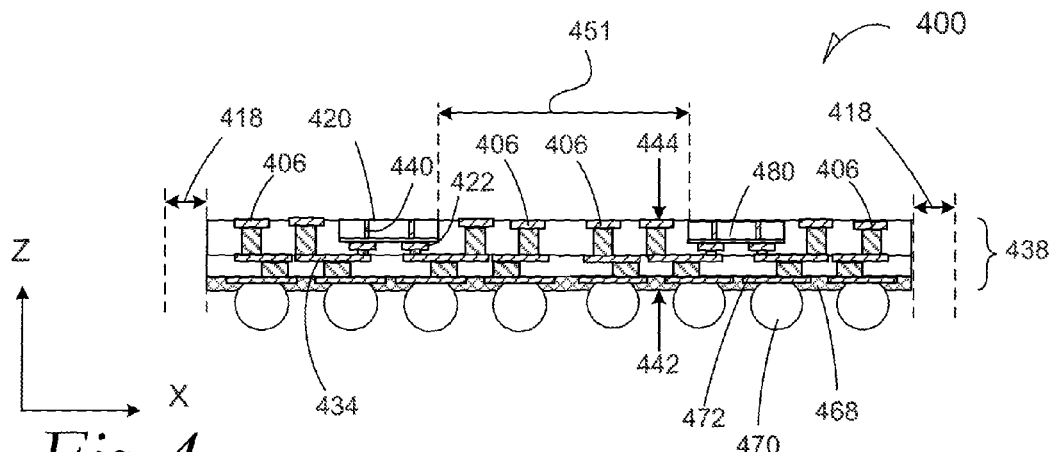
FIG. 4 is a cross-section elevation of a fully embedded die coreless-substrate package-on-package apparatus according to an example embodiment.

FIG. 4 is a cross-section elevation of a fully embedded die coreless-substrate package-on-package (POP) apparatus 400 according to an example embodiment. A TSV die 420 has been embedded in a coreless substrate 438. The coreless substrate 438 includes a land side 442 and a die side 444. Cutting zones 418 are indicated to depict recent processing. Die bond pads 422 and first contacts fill the vias, and traces 434 connect the TSV die 420 to the POP bond pads 406 as well as to electrical bumps 470 that make contact to electrical bump bond pads 472. The POP bond pads 406 may be clustered in groups of two as illustrated and may be configured on about a 0.4 mm pitch.

It can be seen that two occurrences of the TSV die are present, and one may be designated as a TSV die 420 and the other as a lateral-stack TSV die 480. The TSV die 420 has at least one through-silicon via 440. Two through-silicon vias are depicted, one of which is enumerated, but the two illustrated through-silicon vias are presented for simplicity. In an embodiment, a total of 10 through-silicon vias are found in the TSV die 420. It may now be understood that the TSV first die 420 and the lateral-stack TSV die 480 may be identical microelectronic devices according to an embodiment. It may also be understood that the two TSV dice 420 and 480 may be non-identical microelectronic devices according to an embodiment. For example, the TSV die 420 is a microprocessor and the lateral-stack TSV die 480 is a radio-frequency (RF) processor.

Other structures of the TSV die 420 and the lateral-stack TSV die 480 may be recognized by referring to similar structures of the TSV die 120 and the lateral-stack TSV die 220 depicted in FIG. 2. The apparatus 400 may be mounted to a foundation substrate similarly to any of the embodiments set forth for the apparatus depicted and illustrated in FIGS. 1 and 2. It may now be understood that the apparatus 400 may include a subsequent die that is above and coupled to the TSV first die 420, as well as a lateral-stack subsequent die that is above and coupled to the lateral-stack TSV first die 480. It may also now be understood that any disclosed embodiment number of TSV dice may be disposed between the TSV first die 420 and its corresponding subsequent die. Similarly, it may now be understood that any disclosed embodiment number of lateral-stack TSV dice may be disposed between the lateral-stack TSV first die 480 and its corresponding subsequent die.

Figure 4A:
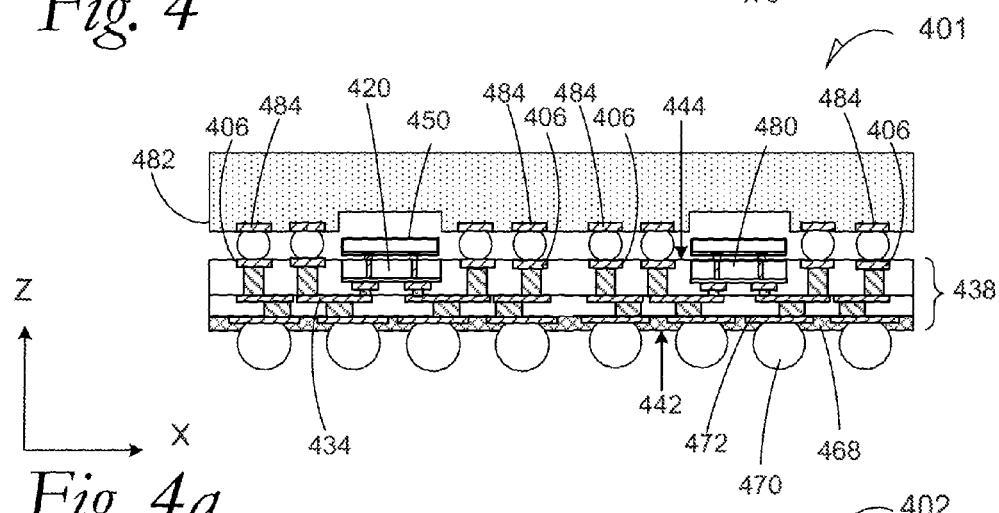
FIG. 4a is a cross-section elevation of the fully embedded die coreless-substrate POP apparatus depicted in FIG. 4 after further processing according to an example embodiment.

FIG. 4a is a cross-section elevation of the fully embedded die coreless-substrate POP apparatus depicted in FIG. 4 after further processing according to an example embodiment. The apparatus 401 has been outfitted with a POP module 482 that includes bond pads 484 to be coupled to the POP bond pads 406 on the coreless substrate 438 at the die side 444. In an embodiment, the POP module 482 includes both active and passive devices. For example where the POP module 482 includes RF capabilities, passive devices such as capacitors, inductors, and resistors may be housed therein. Similarly, active devices may be contained in the POP module 482. In an embodiment, passive devices are affixed to a foundation substrate such as the foundation substrate 148 depicted in FIG. 1.

As illustrated, the TSV first die 420 is coupled to a subsequent die 450, which in this embodiment is in physical contact with the TSV 440 of the TSV first die 420. It may now be understood that more TSV dice may be interjected between the TSV first die 420 and the subsequent die 450 in connection with the POP module 428 according to any of the disclosed embodiments. It may also be understood that more than two fully embedded TSV dice may be configured in the coreless substrate 438, where at least one of the TSV dice is coupled to the POP module 482. The more than two fully embedded TSV dice may be disposed in a square configuration, a linear configuration, or a combination thereof.

Figure 4B:
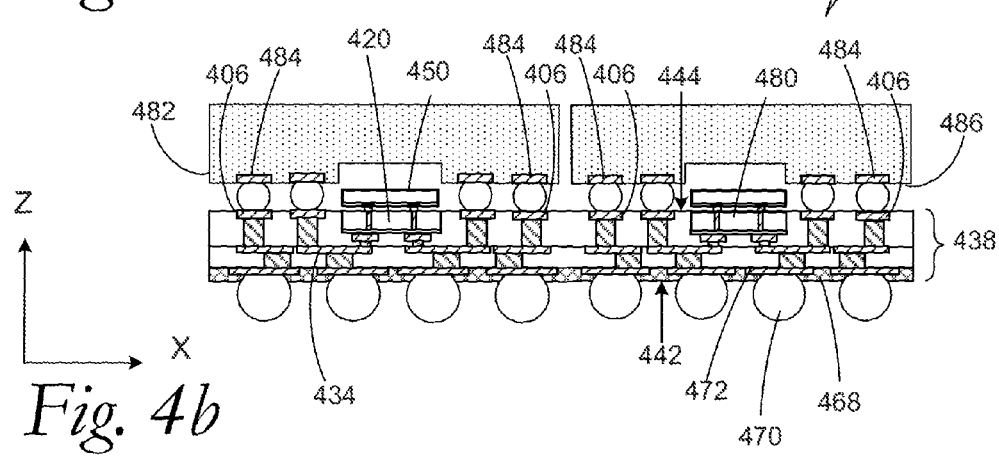
FIG. 4b is a cross-section elevation of the fully embedded die coreless-substrate POP apparatus depicted in FIG. 4 after further processing according to an example embodiment.

FIG. 4b is a cross-section elevation of the fully embedded die coreless-substrate POP apparatus depicted in FIG. 4 after further processing according to an example embodiment. The apparatus 402 has been outfitted with a POP first module 482 and a POP subsequent module 486. The POP first module 482 is coupled to the TSV first die 420 and the POP subsequent module 486 is coupled to the lateral-stack first die 480. It may now be understood that more TSV dice may be interjected between the TSV first die 420 and the subsequent die 450 in connection with the POP first module 428 according to any of the disclosed embodiments. Similarly, it may be understood that more TSV dice may be interjected between the lateral-stack TSV first die 480 and its corresponding lateral-stack subsequent die according to any of the disclosed embodiments.

The POP first module 482 and the POP subsequent module 486 include bond pads 484 to be coupled to the POP bond pads 406 on the coreless substrate 438 at the die side 444. As illustrated, the TSV first die 420 is coupled to a subsequent die 450, which in this embodiment is in physical contact with the TSV 440 of the TSV first die 420. According to an embodiment, the POP first module 482 includes functionality such as a memory cache, and the POP subsequent module 486 includes a different functionality from that of the POP first module 482. In an embodiment, the TSV first die 420 is a processor die and the POP first module 482 is an RF-capable module. The lateral-stack TSV first die 480 is a processor die and the POP subsequent module 486 is a graphics-capable module.

It may also be understood that more than two fully embedded TSV dice may be configured in the coreless substrate 438, where at least one of the TSV dice is coupled to the POP module 482. The more than two fully embedded TSV dice may be disposed in a square configuration, a linear configuration, or a combination thereof.

Figure 5:
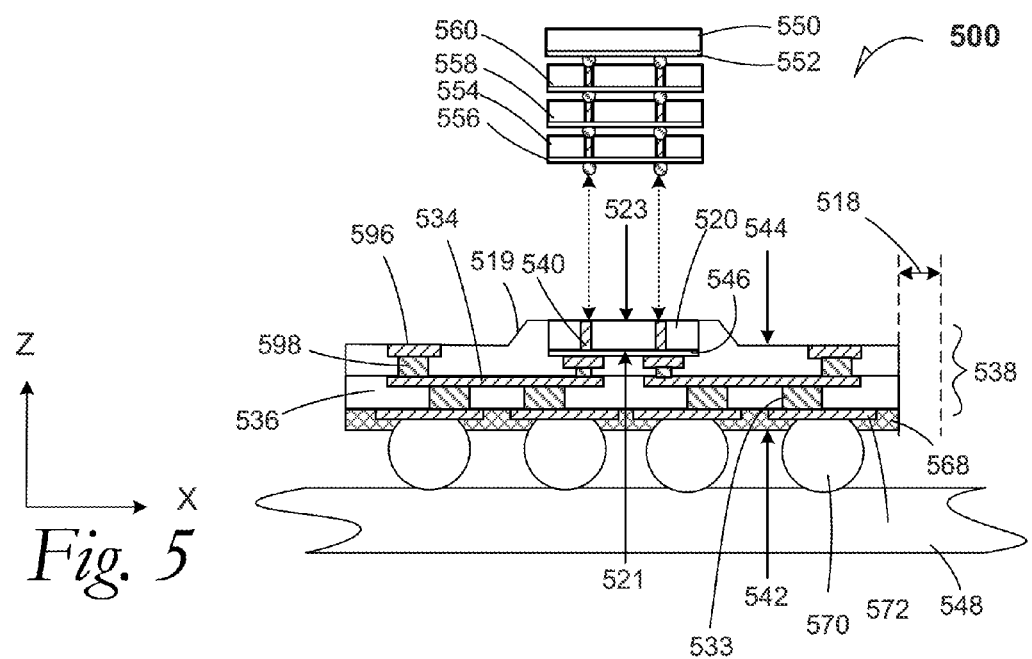
FIG. 5 is a cross-section elevation of a partially embedded through-silicon via die package-on-package coreless-substrate apparatus according to an example embodiment.

FIG. 5 is a cross-section elevation of a partially embedded through-silicon via die package-on-package (POP) coreless-substrate apparatus 500 according to an example embodiment. A TSV die 520 has been partially embedded in a coreless substrate 538. The TSV die 520 has at least one through-silicon via 540. Two through-silicon vias are depicted, one of which is enumerated, but the two illustrated through-silicon vias are presented for simplicity. In an embodiment, a total of 10 through-silicon vias are found in the TSV die 520. The coreless substrate 538 includes a land side 542 and a die side 544. The TSV die 520 also includes an active surface 521 and a backside surface 523 and it can be seen that the active surface 521 of the TSV die 520 is closer to the die side 544 than to the land side 542. As a partially embedded TSV die 520, the TSV die 520 may have an embedding sidewall 519 that results from processing.

The TSV die 520 is also illustrated with a metallization 546 in simplified form. In an embodiment, the metallization 546 has M1 to M11 or any other embodiment set forth for the apparatus 100 depicted in FIG. 1. Other metallization numbers and thickness combinations may be achieved depending upon a given application utility.

The apparatus 500 is mounted to a foundation substrate 548 at the land side 542 according to an embodiment. For example, where the TSV die 520 is part of a hand-held device such as a smart phone or a hand-held reader, the foundation substrate 548 is a motherboard. In an example embodiment where the TSV die 520 is part of a hand-held device such as a smart phone or a hand-held reader, the foundation substrate 548 is an external shell such as the portion an individual touches during use. In an example embodiment where the TSV die 520 is part of a hand-held device such as a smart phone or a hand-held reader, the foundation substrate 548 includes both the motherboard and an external shell such as the portion an individual touches during use.

The apparatus 500 includes a partially embedded TSV die 520. As meant in this disclosure, "partially embedded" means there is one surface of the TSV die 520 that extends (as illustrated in the Z-direction) above the die side 544 of the coreless substrate 538, but not both.

The POP coreless substrate 538 includes several POP bond pads on the die side 544, one of which is indicated with the reference numeral 596. The POP bond pads 596 are coupled through the coreless substrate 538 through a series of vias, one of which is indicated with the reference numeral 598. The vias 598 may exhibit formation that originated from a direction starting from what is now the land side 542. The POP bond pads 596 are coupled to the TSV die 520 through a trace 534.

In an embodiment, the TSV die 520 is part of a larger apparatus that includes a subsequent die 550 (connected by dashed arrows to show seating location) that is disposed above the die side 544 and that is coupled to the TSV die 520 though at least one TSV 540. The TSV die 520 is referred to as a TSV first die 520. The subsequent die 550 is also illustrated with a metallization 552 in simplified depiction, but it may also have M1 to M11 or any number and top metallization thickness differences that are described for the TSV first die 520.

In an embodiment, the TSV die 520 is part of a larger apparatus where the TSV die is a TSV first die 520. The apparatus 500 further includes a TSV second die 554 that is disposed above the die side 544 and that is in physical contact to the TSV first die 520 at the at least one TSV 540. The TSV second die 554 is also depicted with a metallization 556.

It may now be appreciated that the TSV first die 520 may be complemented with a plurality of TSV dice along with a subsequent die 550 similar to any embodiment set forth and illustrated with respect to the apparatus 100 depicted in FIG. 1.

Figure 5A:
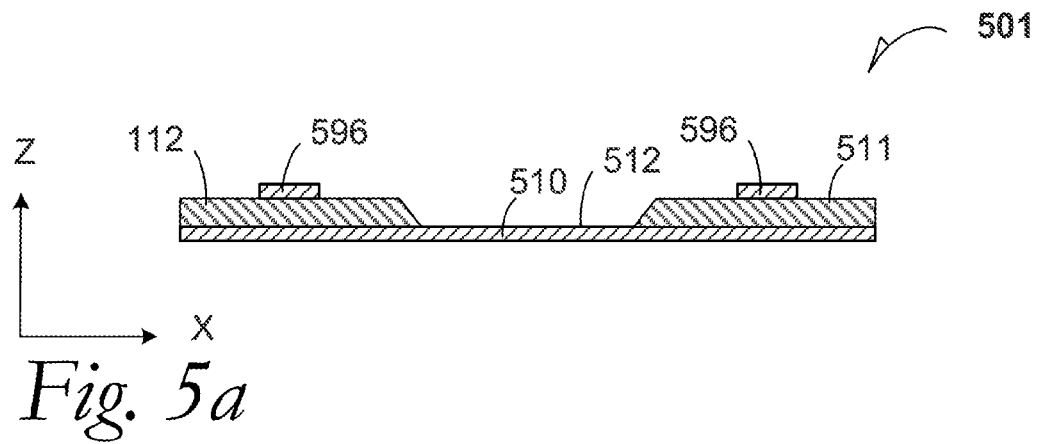
FIG. 5a is a cross-section elevation of a partially embedded die coreless-substrate apparatus during processing according to an example embodiment.

FIG. 5a is a cross-section elevation of a partially embedded die coreless-substrate apparatus 501 during processing according to an example embodiment. The apparatus 501 represents early processing and is related to the apparatus 500 depicted in FIG. 5. An etch-stop layer 510 such as a copper foil 510 is provided with a die-mounting surface 512. A recess has been formed in a second layer 511, and a POP bond pad 596 has been formed on the second layer 511.

Figure 5B:
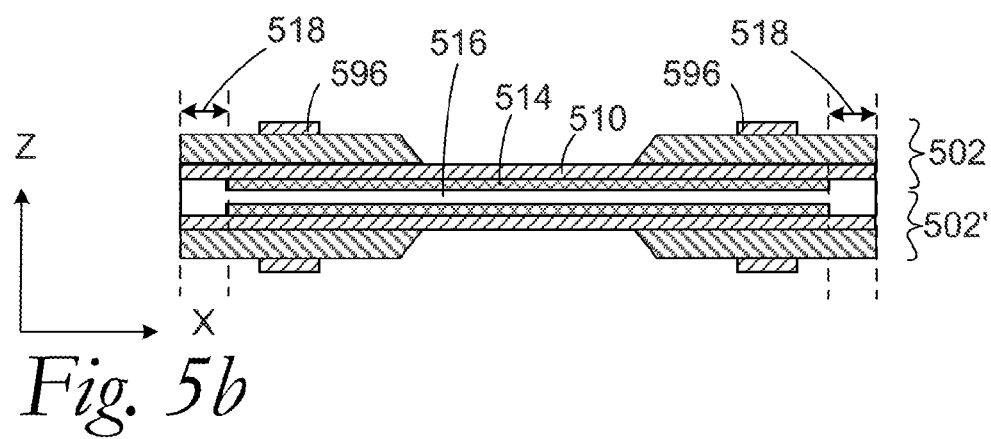
FIG. 5b is a cross-section elevation of the embedded die coreless-substrate apparatus depicted in FIG. 5a during further processing according to an embodiment.

FIG. 5b is a cross-section elevation of the embedded die coreless-substrate apparatus depicted in FIG. 5a during further processing according to an embodiment. During processing, the apparatus 501 may be mated to an identical structure in order to build two-back-to-back apparatus for processing utility. The apparatus 502 has been enlarged by back-to-back mating the original apparatus 502 to a similar apparatus 502'. Consequently, processing throughput is effectively doubled. Description of the apparatus 502 and 502' may be referred to by reference numerals ascribed to the apparatus 502, but it may be understood that duplicate processing and structures are contained in the apparatus 502'.

The apparatus 502 includes an adhesion release layer 514 and an adhesive binder 516. A cutting zone 518 is provided at each end of the apparatus 502 in the X-dimension for separation processing as illustrated further.

Figure 5C:
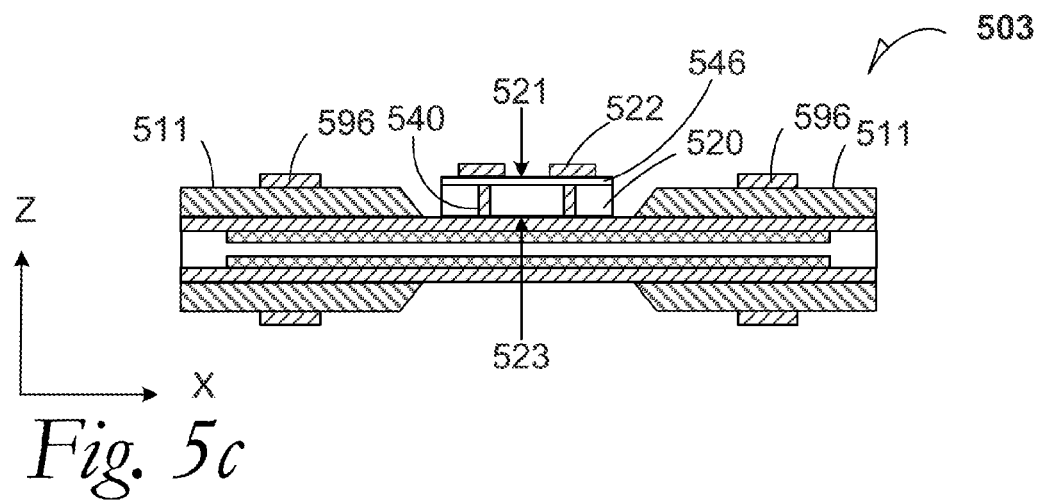
FIG. 5c is a cross-section elevation of the apparatus depicted in FIG. 5b after further processing according to an embodiment.

FIG. 5c is a cross-section elevation of the apparatus depicted in FIG. 5b after further processing according to an embodiment. The apparatus 503 has been further processed by placing a TSV die 520 upon the etch-stop layer 510. In an embodiment, the etch-stop layer 510 is a copper foil. In an embodiment, the etch-stop layer 510 is an organic material. Other materials may be used for the etch-stop layer 510 depending upon a specific application. The TSV die 520 has a plurality of die bond pads, one of which is indicated with reference numeral 522. The TSV die 520 has an active surface 521 that is on the same surface as the die bond pads 522. The number of die bond pads 522 is show as only two for illustrative simplicity and these die bond pads 522 are not necessarily in contact with the vias 540. The TSV die 520 has a backside surface 523 that is opposite the active surface 521. Further, the TSV die 520 has a metallization 546 that may include any number and comparative thickness metallizations set forth in this disclosure. The TSV die 520 is also depicted with two through-silicon vias, one of which is delineated with the reference numeral 540. In an embodiment, formation of the die bond pad 522 is done by a semi-additive plating process. Where the die bond pad 522 and the POP bond pad 596 may be formed at a similar Z-height, formation of both the bond pad 522 and the POP bond pad 596 is done by a semi-additive plating process.

Figure 5D:
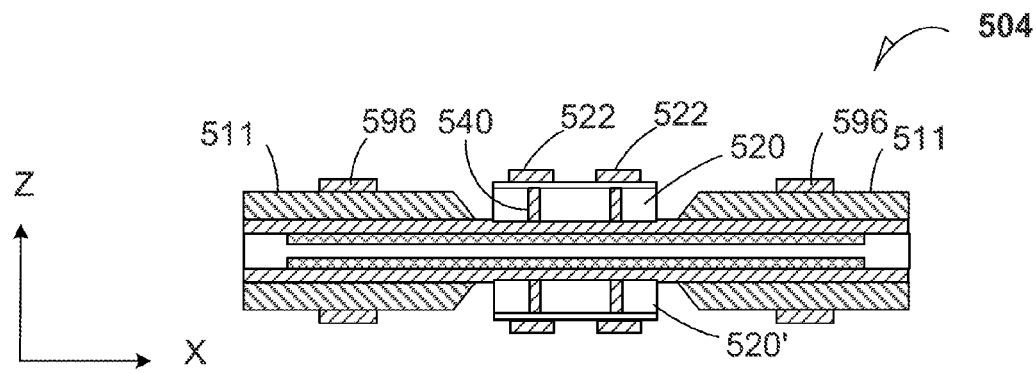
FIG. 5d includes the addition of the TSV die to form the apparatus.

FIG. 5d includes the addition of the TSV die 520' to form the apparatus 504.

Figure 5E:
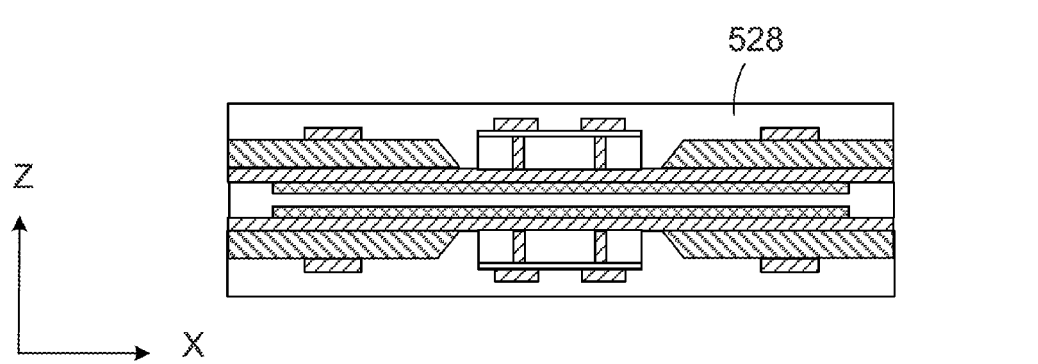
FIG. 5e is a cross-section elevation of the apparatus depicted in FIG. 5d after further processing according to an embodiment.

FIG. 5e is a cross-section elevation of the apparatus depicted in FIG. 5d after further processing according to an embodiment. The apparatus 505 has been processed to receive a first dielectric 528. In an embodiment, the first dielectric 528 is patterned such as by spinning on and curing a dielectric upon a wafer-scale array of apparatus of which the apparatus 505 is merely a subset for illustrative simplicity.

Figure 5F:
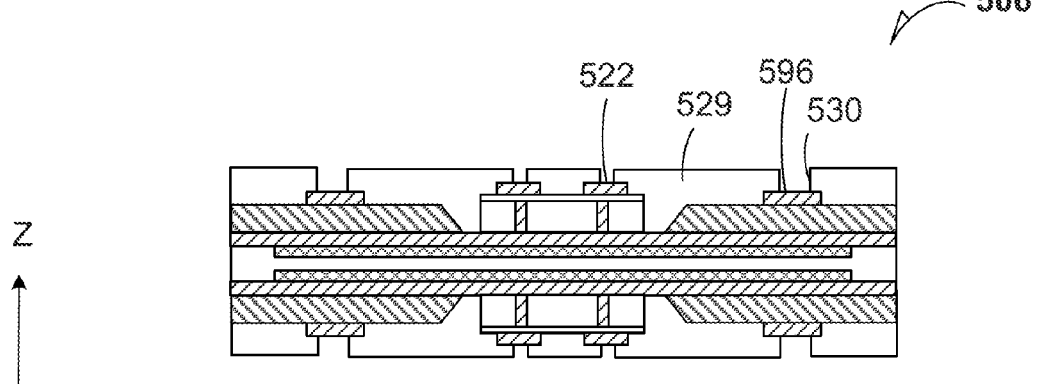
FIG. 5f is a cross-section elevation of the apparatus depicted in FIG. 5e after further processing according to an embodiment.

FIG. 5f is a cross-section elevation of the apparatus depicted in FIG. 5e after further processing according to an embodiment. The apparatus 506 has been processed such that the first dielectric 528, depicted in FIG. 5d, has been patterned to form a patterned first dielectric 529 and several recesses have been formed therein, one of which is indicated with reference numeral 530. The recesses 530 expose the die bond pads 522 as well as the POP bond pads 596.

Figure 5G:
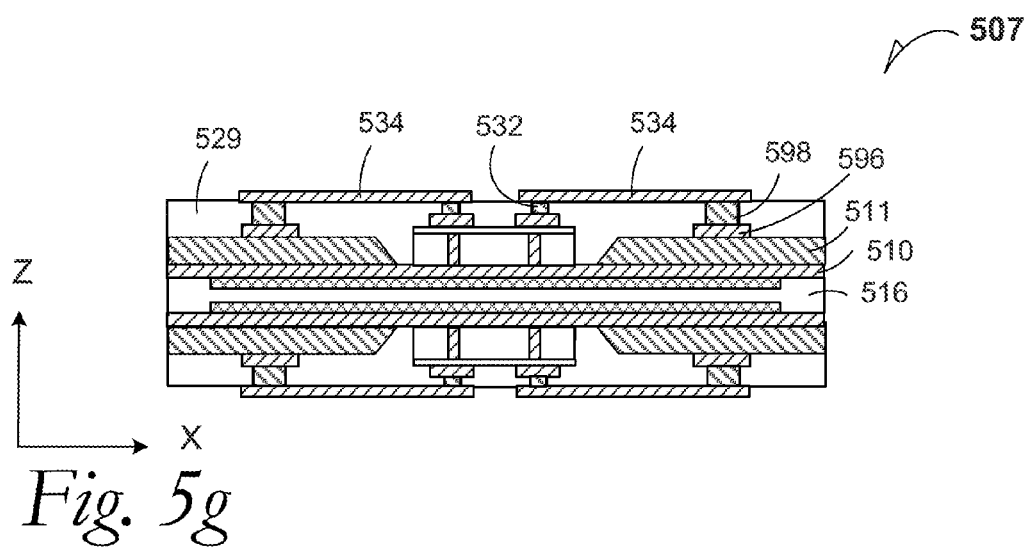
FIG. 5g is a cross-section elevation of the apparatus depicted in FIG. 5g after further processing according to an embodiment.

FIG. 5*g* is a cross-section elevation of the apparatus depicted in FIG. 5*g* after further processing according to an embodiment. The apparatus 507 has been processed such that first contacts 532 fill the vias 530 (FIG. 5*f*) and traces 534 are formed upon the patterned first dielectric 529. In an embodiment, the first contacts 532 are copper and the several die bond pads 522 are also copper. In an embodiment, other metals may be selected for the first contacts 532.

Figure 5H:
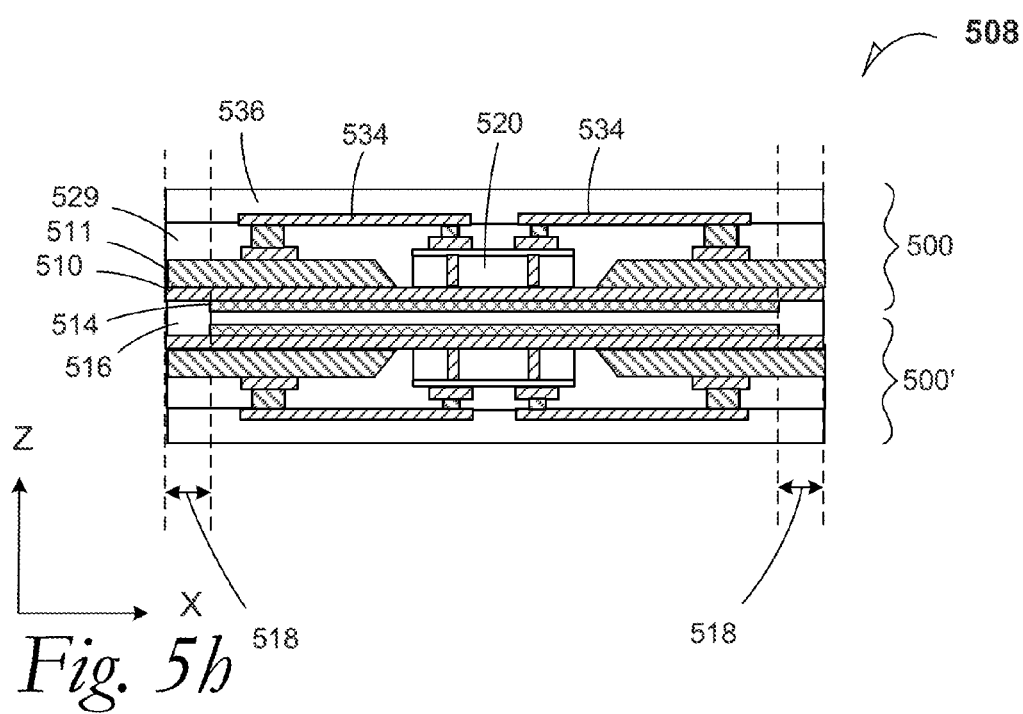
FIG. 5h is a cross-section elevation of the apparatus depicted in FIG. 5g after further processing according to an embodiment.

FIG. 5*h* is a cross-section elevation of the apparatus depicted in FIG. 5*g* after further processing according to an embodiment. The apparatus 108 has been processed with a second dielectric 536 such that the patterned first dielectric 129 and the traces 134 are enclosed. Processing of the second dielectric 536 is done by spinning on and curing according to an example embodiment, and it may be done with a wafer-scale array. It may now be appreciated that a BBUL-C is being formed to couple the TSV die 520 to the outside world. Although the BBUL-C is illustrated with the patterned first dielectric 529 and the second dielectric 536, it may be understood that several layers of metallization and dielectric can be used to form the BBUL-C, which ultimately is a coreless substrate 538 with an embedded TSV die 520.

As configured in FIG. 5*h*, the two apparatus may be singulated by removing material within the cutting zone 518. With the cutting zone 518 removed, the adhesion release layers 514 allow the two apparatus to be drawn apart.

Further processing is done to remove the patterned dielectric layer 519 and to expose the die backside surface 523 as illustrated in FIG. 5. It may now be understood that two partially embedded dice may be installed into the coreless substrate 538 similarly to the TSV first die 120 and the TSV subsequent die 220 as depicted in FIG. 2. Similarly, where spacing 451 (see FIG. 4) is established, such spacing may accommodate POP bond pads disposed between the two TSV dice similarly to the spacing 451 depicted in FIG. 4. It may now be understood that a plurality of partially embedded TSV dice are installable into the coreless substrate 538 similarly to the descriptions describing FIGS. 4*a* and 4*b* according to several embodiments. In each illustrated and discussed embodiment, a subsequent die is coupleable to a corresponding TSV die similarly to the illustrated embodiments. Similarly, at least one POP module may be installed to make contact with the POP bond pads 596.

Figure 6:
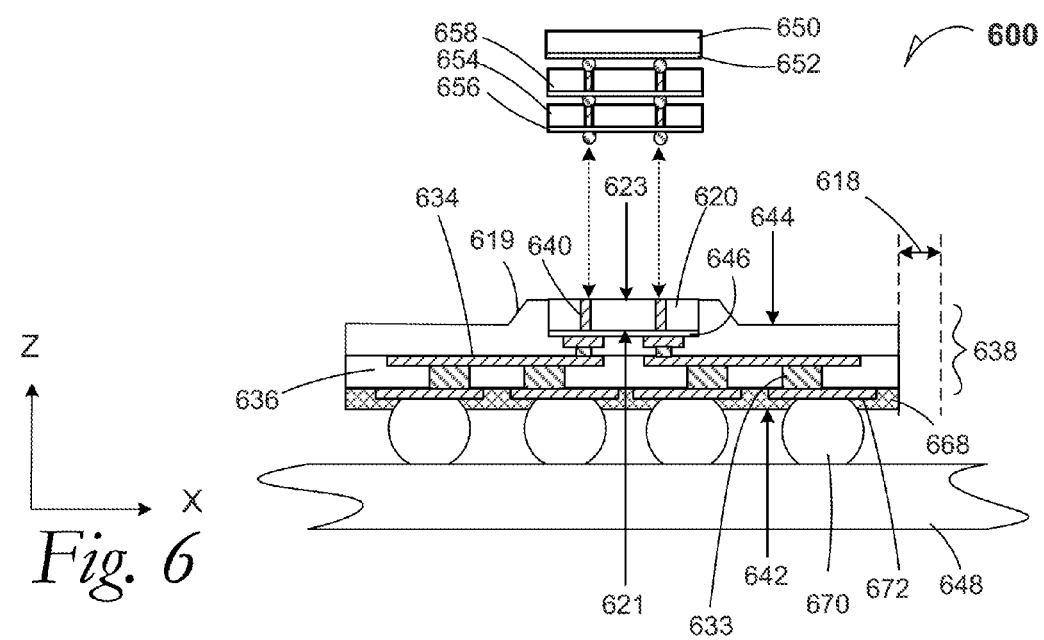
FIG. 6 is a cross-section elevation of a partially embedded through-silicon via die coreless-substrate apparatus according to an example embodiment.

FIG. 6 is a cross-section elevation of a partially embedded through-silicon via die coreless-substrate apparatus 600 according to an example embodiment. A TSV die 620 has been partially embedded in a coreless substrate 638. The TSV die 620 has at least one through-silicon via 640. Two through-silicon vias are depicted, one of which is enumerated, but the two illustrated through-silicon vias are presented for simplicity. In an embodiment, a total of 10 through-silicon vias are found in the TSV die 620. The coreless substrate 638 includes a land side 642 and a die side 644. The TSV die 620 also includes an active surface 621 and a backside surface 623 and it can be seen that the active surface 621 of the TSV die 620 is closer to the die side 644 than to the land side 642. As a partially embedded TSV die 620, the TSV die 620 may have an embedding sidewall 619 that results from processing.

The TSV die 620 is also illustrated with a metallization 646 in simplified form. In an embodiment, the metallization 646 has M1 to M11 or any other embodiment set forth for the apparatus 100 depicted in FIG. 1. Other metallization numbers and thickness combinations may be achieved depending upon a given application utility.

The apparatus 600 is mounted to a foundation substrate 648 at the land side 642 according to an embodiment. For example, where the TSV die 620 is part of a hand-held device such as a smart phone or a hand-held reader, the foundation substrate 648 is a motherboard. In an example embodiment where the TSV die 620 is part of a hand-held device such as a smart phone or a hand-held reader, the foundation substrate 648 is an external shell such as the portion an individual touches during use. In an example embodiment where the TSV die 620 is part of a hand-held device such as a smart phone or a hand-held reader, the foundation substrate 648 includes both the motherboard and an external shell such as the portion an individual touches during use.

The apparatus 600 includes a partially embedded TSV die 620. As meant in this disclosure," The TSV die is coupled to the foundation substrate 648 through the coreless substrate 638 through traces 634.

In an embodiment, the TSV die 620 is part of a larger apparatus that includes a subsequent die 650 (connected by dashed arrows to show seating location) that is disposed above the die side 644 and that is coupled to the TSV die 620 though at least one TSV 640. The TSV die 620 is referred to as a TSV first die 620. The subsequent die 650 is also illustrated with a metallization 652 in simplified depiction, but it may also have M1 to M11 or any number and top metallization thickness differences that are described for the TSV first die 620.

In an embodiment, the TSV die 620 is part of a larger apparatus where the TSV die is a TSV first die 620. The apparatus 600 further includes a second TSV die 654 that is disposed above the die side 644 and that is in physical contact to the TSV first die 620 at the at least one TSV 640. The TSV second die 654 is also depicted with a metallization 656.

It may now be appreciated that the TSV first die 620 may be complemented with a plurality of TSV dice along with a subsequent die 650 similar to any embodiment set forth and illustrated with respect to the apparatus 100 depicted in FIG. 1.

Figure 7:
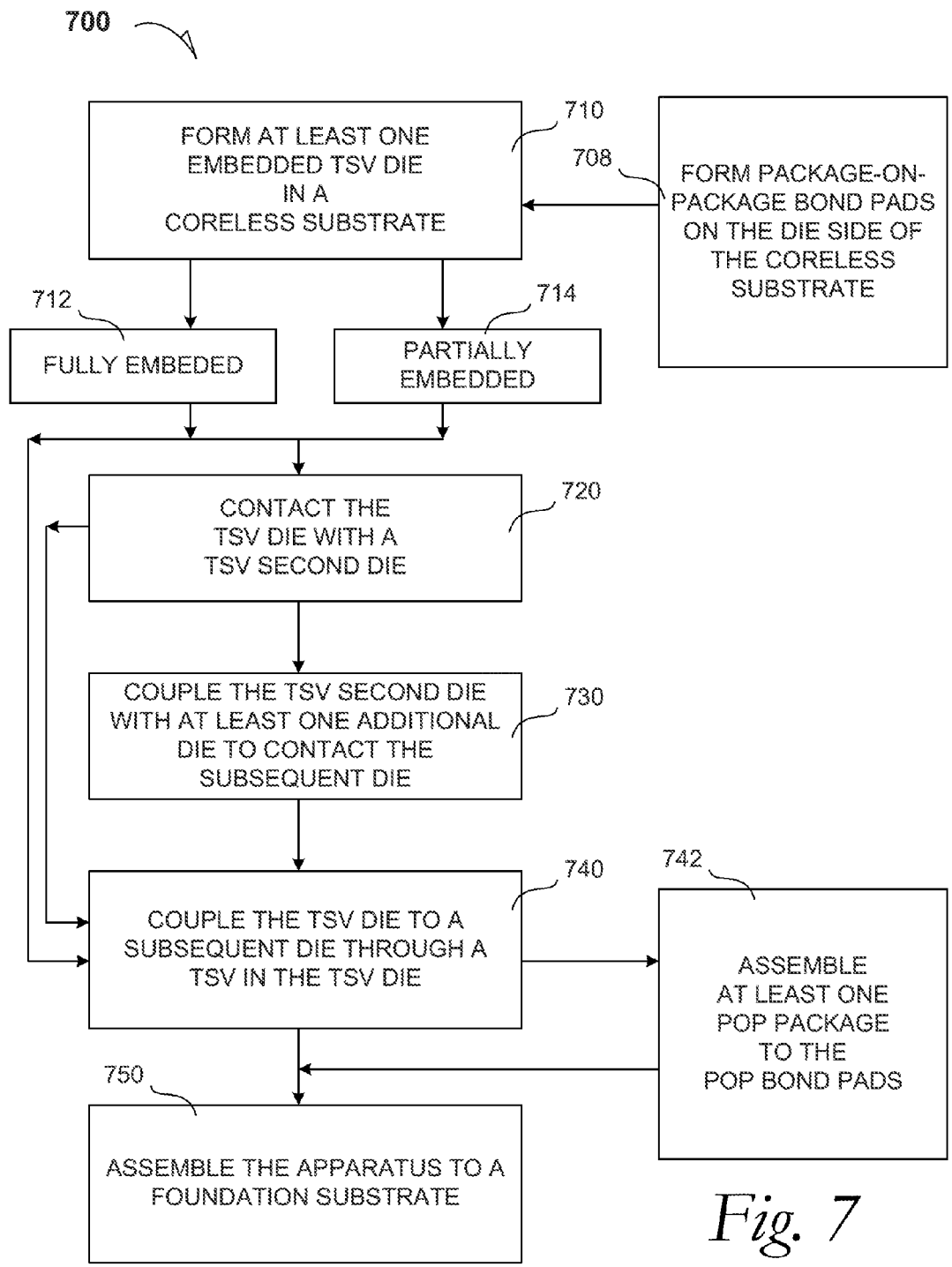
FIG. 7 a process and method flow diagram according to several embodiments.

FIG. 7 a process and method flow diagram 700 according to several embodiments.

At 710, the process includes forming at least one embedded TSV die in a coreless substrate. In a non-limiting example embodiment, the TSV first die 120, depicted in FIG. 1*h*, has been formed in the coreless substrate 138.

At 708, a process embodiment includes forming POP bond pads on the die side of the coreless substrate. In a non-limiting example embodiment, POP bond pads 306 are formed on the die side 344 of the coreless substrate 338 as depicted in FIG. 3.

At 740, the process includes coupling the TSV die to a subsequent die through a TSV in the TSV die. In a non-limiting example embodiment, the TSV die 420 is coupled to the subsequent die 450 as depicted in FIG. 4*a*. In a non-limiting example embodiment, the TSV first die 120 is coupled to the subsequent die 150 through at least one more TSV die.

At 720, the process includes contacting the TSV die, as a TSV first die, with a TSV second die. In a non-limiting example embodiment, the TSV first die 620 is contacted with the TSV second die 656, which in turn is coupled to the subsequent die 650.

At 730, the process includes coupling the TSV second die with at least one additional die to contact the subsequent die. In a non-limiting example embodiment, the TSV second die 656 is contacted with the TSV third die 654, which in turn is coupled to the subsequent die 650. In an embodiment, the process flows from 730 to 740.

At 750, a method embodiment includes assembling the TSV die apparatus to a foundation substrate. In a non-limiting example embodiment, the apparatus 500 is assembled to the foundation substrate as depicted in FIG. 5.

At 742, a method embodiment includes assembling at least one POP package POP bond pads on the die side of the coreless substrate. In a non-limiting example embodiment, a POP package 482 is assembled to the coreless substrate 438.

Figure 8:
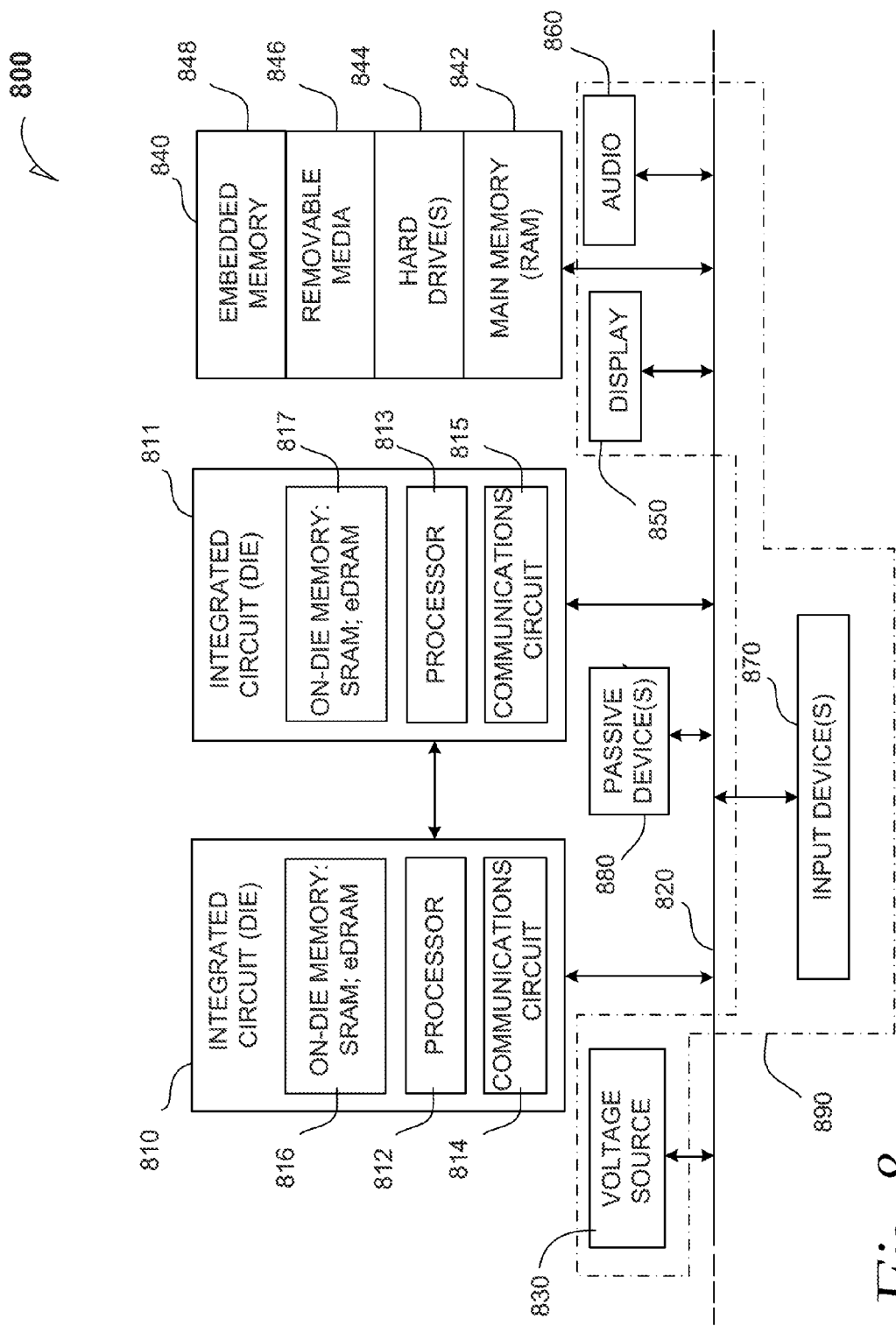
FIG. 8 is a schematic of a computer system 800 according to an embodiment.

FIG. 8 is a schematic of a computer system 800 according to an embodiment. The computer system 800 (also referred to as the electronic system 800) as depicted can embody an embedded TSV-die coreless substrate (BBUL-C TSV die) according to any of the several disclosed embodiments and their equivalents as set forth in this disclosure. The computer system 800 may be a mobile device such as a netbook computer. The computer system 800 may be a mobile device such as a wireless smart phone. The computer system 800 may be a desktop computer. The computer system 800 may be a hand-held reader.

In an embodiment, the electronic system 800 is a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In some embodiments, the voltage source 830 supplies current to the integrated circuit 810 through the system bus 820.

The integrated circuit 810 is electrically coupled to the system bus 820 and includes any circuit, or combination of circuits according to an embodiment. In an embodiment, the integrated circuit 810 includes a processor 812 that can be of any type. As used herein, the processor 812 may mean any type of circuit such as, but not limited to, a microprocessor, a microcontroller, a graphics processor, a digital signal processor, or another processor. In an embodiment, the processor 812 is an TSV embedded die disclosed herein. In an embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems. In an embodiment, the processor 810 includes on-die memory 816 such as static random-access memory (SRAM). In an embodiment, the processor 810 includes embedded on-die memory 816 such as embedded dynamic random-access memory (eDRAM).

In an embodiment, the integrated circuit 810 is complemented with a subsequent integrated circuit 811 such as a lateral-stack TSV embedded subsequent die embodiment. In an embodiment, the integrated circuit 810 is complemented with a subsequent integrated circuit 811 such as a subsequent die embodiment that is coupled to the TSV embedded die. Useful embodiments include a dual processor 813 and a dual communications circuit 815 and dual on-die memory 817 such as SRAM. In an embodiment, the dual integrated circuit 810 includes embedded on-die memory 817 such as eDRAM.

In an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the second through fifth die and the subsequent in a die stack according to an embodiment.

In an embodiment, the electronic system 800 also includes a display device 850, an audio output 860. In an embodiment, the electronic system 800 includes an input device such as a controller 870 that may be a keyboard, mouse, trackball, game controller, microphone, voice-recognition device, or any other input device that inputs information into the electronic system 800. In an embodiment, an input device 870 is a camera. In an embodiment, an input device 870 is a digital sound recorder. In an embodiment, an input device 870 is a camera and a digital sound recorder.

As shown herein, the integrated circuit 810 can be implemented in a number of different embodiments, including embedded TSV die according to any of the several disclosed embodiments and their equivalents, an electronic system, a computer system, one or more methods of fabricating an integrated circuit, and one or more methods of fabricating an electronic assembly that includes embedded TSV die according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed embedded TSV die embodiments and their equivalents.

Figure 9:
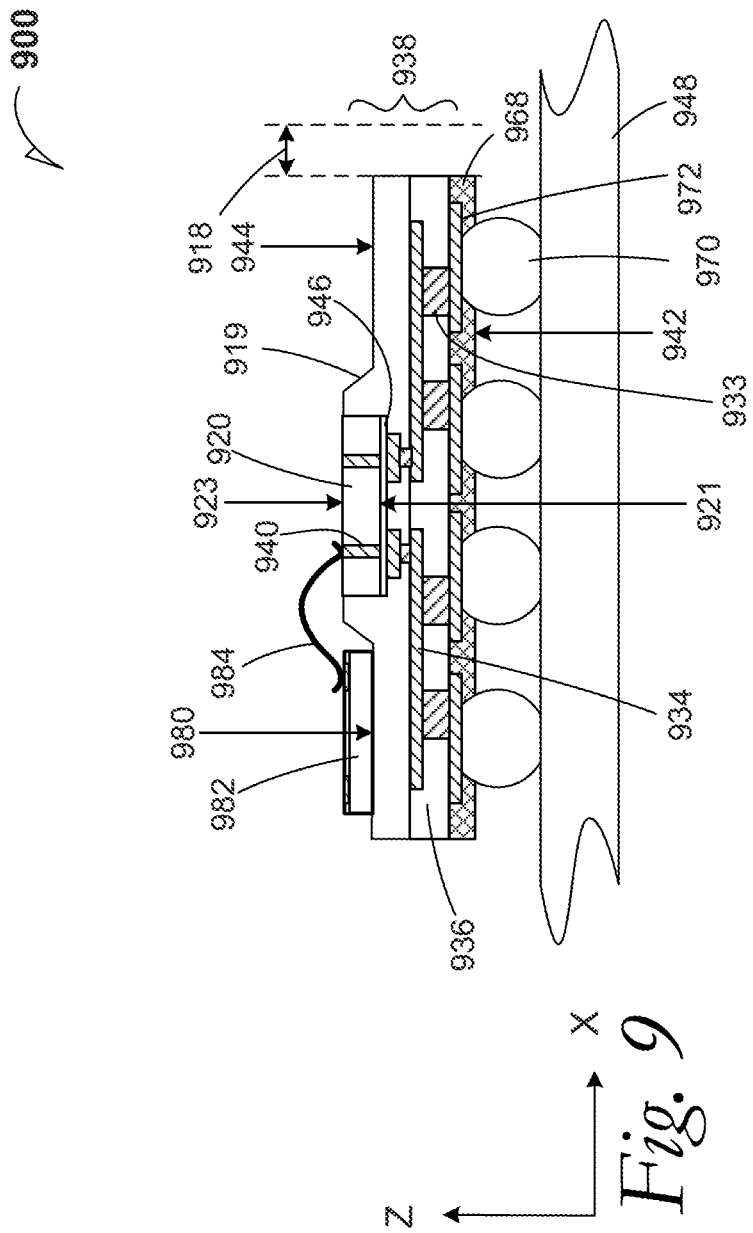
FIG. 9 is a cross-section elevation of a partially embedded through-silicon via die coreless-substrate apparatus with at least one wire-bond die according to an example embodiment.

FIG. 9 is a cross-section elevation of a partially embedded through-silicon via die coreless-substrate apparatus 900 according to an example embodiment. A TSV die 920 has been partially embedded in a coreless substrate 938. The TSV die 920 has at least one through-silicon via 940. Two through-silicon vias are depicted, one of which is enumerated, but the two illustrated through-silicon vias are presented for simplicity. In an embodiment, a total of 10 through-silicon vias are found in the TSV die 920. The coreless substrate 938 includes a land side 942 and a die side 944. The TSV die 920 also includes an active surface 921 and a backside surface 923 and it can be seen that the active surface 921 of the TSV die 920 is closer to the die side 944 than to the land side 942. As a partially embedded TSV die 920, the TSV die 920 may have an embedding sidewall 919 that results from processing.

The TSV die 820 is also illustrated with a metallization 946 in simplified form. In an embodiment, the metallization 946 has M1 to M1 or any other embodiment set forth for the apparatus 100 depicted in FIG. 1. Other metallization numbers and thickness combinations may be achieved depending upon a given application utility.

The TSV die 920 is wire-bonded to a lateral subsequent die 982 by at least one bond wire 984 that makes contact to the at least one TSV 940. In this embodiment, Z-height utility may be preserved by seating the lateral subsequent die 982 onto a lateral footprint 980 of the die side 944.

The apparatus 900 is mounted to a foundation substrate 948 at the land side 942 according to an embodiment. For example, where the TSV die 920 is part of a hand-held device such as a smart phone and the lateral subsequent die 982 is an RF-signal processor, the foundation substrate 948 is a motherboard. In an example embodiment where the TSV die 920 is part of a hand-held device such as a smart phone and the lateral subsequent die 982 is an RF-signal processor, the foundation substrate 948 is an external shell such as the portion an individual touches during use. In an example embodiment where the TSV die 920 is part of a hand-held device such as a smart phone and the lateral subsequent die 982 is an RF-signal processor, the foundation substrate 948 includes both the motherboard and an external shell such as the portion an individual touches during use.

The TSV die 920 is coupled to the foundation substrate 648 through the coreless substrate 638 through traces 634.

Although an embedded TSV die may refer to a processor chip, an RF chip or a memory chip may be mentioned in the same sentence, but it should not be construed that they are equivalent structures. Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Terms such as "upper" and "lower" "above" and "below" may be understood by reference to the illustrated X-Z coordinates, and terms such as "adjacent" may be understood by reference to X-Y coordinates or to non-Z coordinates.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process, comprising:
    forming at least one die including a through-silicon via disposed therein (TSV die); wherein the TSV die is embedded in a first dielectric layer of a coreless substrate, wherein the coreless substrate includes a land side and a die side; wherein the TSV die includes an active surface and a backside surface; wherein the active surface is closer to the die side than to the land side; and wherein at least one trace disposed within the coreless substrate is connected to at least one die bond pad on the TSV die active surface through a filled via disposed within the first dielectric layer of the coreless substrate; and
    mounting the land side to a foundation substrate.

2. The process of claim 1, wherein the TSV die is fully embedded in the coreless substrate.

3. The process of claim 1, wherein the TSV die is fully embedded in the coreless substrate, and further comprising disposing a subsequent die above the die side coupled to the TSV die though at least one TSV.

4. The process of claim 1, wherein the TSV die is a first TSV die and is fully embedded in the coreless substrate, and further comprising:
    disposing a second TSV die above the die side in contact with the TSV first die;
    disposing a third TSV die above and contacting the second TSV die;
    disposing a fourth TSV die above and contacting the third TSV die; and
    disposing a subsequent die above and in contact with the fourth TSV die.

5. The process of claim 1, wherein the TSV die is a first TSV die and is fully embedded in the coreless substrate, and further comprising:
    disposing a second TSV die above the die side and in contact with the first TSV die;
    disposing a third TSV die above and in contact with the second TSV die;
    disposing a fourth TSV die above and in contact with the third TSV die;
    disposing a fifth TSV die above and in contact with the fourth TSV die;
    disposing a sixth TSV die above and in contact with the fifth TSV die; and
    disposing a subsequent die above and in contact with the sixth TSV die.

6. The process of claim 1, wherein the TSV die is a first TSV die that is fully embedded in the coreless substrate, and further comprising:
    fully embedding a lateral-stack TSV die in the coreless substrate; and
    disposing a subsequent die above the die side and coupled to the first TSV die though at least one TSV.

7. The process of claim 1, wherein the TSV die is a first TSV die that is fully embedded in the coreless substrate, and further comprising:
    fully embedding a first lateral-stack TSV die in the coreless substrate;
    disposing a subsequent lateral-stack die above the die side coupled to the first lateral-stack TSV die through at least one TSV; and
    disposing a subsequent die above the die side coupled to the first TSV die though at least one TSV.

8. The process of claim 1, wherein the TSV die is a first TSV die that is fully embedded in the coreless substrate, and further comprising:
    contacting a second TSV die with the first TSV die;
    disposing a subsequent TSV die above the die side coupled to the second TSV die through at least one TSV;
    fully embedding a first lateral-stack TSV die in the coreless substrate;
    contacting a second lateral-stack TSV die with the first lateral-stack TSV die;
    contacting a third lateral-stack TSV die with the second lateral-stack TSV die; and
    disposing a subsequent lateral-stack die above the die side coupled to the third lateral-stack TSV die through at least one TSV.

9. The process of claim 1, wherein the TSV die is fully embedded in the coreless substrate, and further comprising disposing at least one package-on-package (POP) bond pad on the die side.

10. The process of claim 1, wherein the TSV die is fully embedded in the coreless substrate, and further comprising:
    disposing at least one POP bond pad on the die side; and
    disposing a device module upon the die side and in contact with the POP bond pad.

11. The process of claim 1, wherein the TSV die is fully embedded in the coreless substrate, and further comprising:
disposing at least one package-on-package (POP) bond pad on the die side; and
disposing a subsequent die above the die side coupled to the TSV die though at least one TSV.

12. The process of claim 1, wherein the TSV die is a first TSV die that is fully embedded in the coreless substrate, and further comprising:
fully embedding a first lateral TSV die in the coreless substrate;
disposing a subsequent die above the die side coupled to the first TSV die though at least one TSV;
disposing a subsequent lateral die above the die side coupled to the first lateral TSV die though at least one TSV; and
disposing at least one package-on-package (POP) bond pad on the die side.

13. The process of claim 1, wherein the TSV die is a first TSV die that is fully embedded in the coreless substrate, and further comprising:
fully embedding a first lateral TSV die in the coreless substrate;
disposing a subsequent die above the die side and coupled to the first TSV die though at least one TSV;
disposing a subsequent lateral die above the die side and coupled to the first lateral TSV die though at least one TSV;
disposing a first package-on-package (POP) bond pad on the die side;
disposing a first POP package on the die side in contact with the first POP bond pad;
disposing a subsequent POP bond pad on the die side; and
disposing a subsequent POP package on the die side in contact with the subsequent POP bond pad.

14. The process of claim 1, wherein the TSV die is a first TSV die that is fully embedded in the coreless substrate, and further comprising:
disposing at least one package-on-package (POP) bond pad on the die side;
fully embedding a first lateral-stack TSV die in the coreless substrate;
disposing a subsequent lateral-stack die above the die side and coupled to the first lateral-stack TSV die through at least one TSV; and
disposing a subsequent die above the die side and coupled to the first TSV die though at least one TSV.

15. The process of claim 1, wherein the TSV die is a first TSV die that is fully embedded in the coreless substrate, and further comprising:
disposing at least one package-on-package (POP) bond pad on the die side;
contacting a second TSV die with the first TSV die;
disposing a subsequent TSV die above the die side and coupled to the second TSV die through at least one TSV;
fully embedding a first lateral-stack TSV die in the coreless substrate;
contacting a second lateral-stack TSV die with the first lateral-stack TSV die;
contacting a third lateral-stack TSV die with the second lateral-stack TSV die; and
disposing a subsequent lateral-stack die above the die side and coupled to the third lateral-stack TSV die through at least one TSV.

16. The process of claim 1, wherein the TSV die is a first TSV die that is fully embedded in the coreless substrate, and further comprising:
fully embedding a first lateral TSV die that in the coreless substrate; and
disposing a subsequent die above the die side coupled to the TSV die though at least one TSV.

17. The process of claim 1, wherein the embedded die is partially embedded in the coreless substrate.

18. The process of claim 1, wherein the TSV die is partially embedded in the coreless substrate, and further comprising disposing a subsequent die above the die side coupled to the TSV die though at least one TSV.

19. The process of claim 1, wherein the TSV die is a first TSV die and is partially embedded in the coreless substrate, and further comprising:
disposing a second TSV die above the die side and in contact to the TSV first die;
disposing a third TSV die above and in contact to the second TSV die;
disposing a fourth TSV die above and in contact to the third TSV die; and
disposing a subsequent die above and in contact to the fourth TSV die.

20. The process of claim 1, wherein the TSV die is a first TSV die and is partially embedded in the coreless substrate, and further comprising:
disposing a second TSV die above the die side and in contact to the first TSV die;
disposing a third TSV die above and in contact to the second TSV die;
disposing a fourth TSV die above and in contact to the third TSV die;
disposing a fifth TSV die above and in contact to the fourth TSV die;
disposing a sixth TSV die above and in contact to the fifth TSV die; and
disposing a subsequent die above and in contact to the sixth TSV die.

21. The process of claim 1, wherein the TSV die is a first TSV die that is partially embedded in the coreless substrate, and further comprising:
partially embedding a lateral-stack TSV die in the coreless substrate; and
disposing a subsequent die above the die side coupled to the first TSV die though at least one TSV.

22. The process of claim 1, wherein the TSV die is a first TSV die that is partially embedded in the coreless substrate, and further comprising:
partially embedding a first lateral-stack TSV die in the coreless substrate;
disposing a subsequent lateral-stack die above the die side coupled to the first lateral-stack TSV die through at least one TSV; and
disposing a subsequent die above the die side coupled to the first TSV die though at least one TSV.

23. The process of claim 1, wherein the TSV die is a first TSV die that is partially embedded in the coreless substrate, and further comprising:
contacting a second TSV die with the first TSV die;
disposing a subsequent TSV die above the die side coupled to the second TSV die through at least one TSV;
partially embedding a first lateral-stack TSV die in the coreless substrate;
contacting a second lateral-stack TSV die with the first lateral-stack TSV die;
contacting a third lateral-stack TSV die with the second lateral-stack TSV die; and disposing a subsequent lateral-stack die above the die side coupled to the third lateral-stack TSV die through at least one TSV.

24. The process of claim 1, wherein the TSV die is partially embedded in the coreless substrate, and further comprising disposing at least one package-on-package (POP) bond pad on the die side.

25. The process of claim 1, wherein the TSV die is partially embedded in the coreless substrate, and further comprising:
    disposing at least one POP bond pad on the die side; and
    disposing a device module upon the die side in contact with the POP bond pad.

26. The process of claim 1, wherein the TSV die is partially embedded in the coreless substrate, and further comprising:
    disposing at least one package-on-package (POP) bond pad on the die side; and
    disposing a subsequent die above the die side coupled to the TSV die though at least one TSV.

27. The process of claim 1, wherein the TSV die is a first TSV die that is partially embedded in the coreless substrate, and further comprising:
    partially embedding a first lateral TSV die in the coreless substrate;
    disposing a subsequent die disposed the die side coupled to the first TSV die though at least one TSV;
    disposing a subsequent lateral die above the die side coupled to the first lateral TSV die though at least one TSV; and
    disposing at least one package-on-package (POP) bond pad on the die side.

28. The process of claim 1, wherein the TSV die is a first TSV die that is partially embedded in the coreless substrate, and further comprising:
    partially embedding a first lateral TSV die that is partially embedded in the coreless substrate;
    disposing a subsequent die above the die side and coupled to the first TSV die though at least one TSV;
    disposing a subsequent lateral die above the die side coupled to the first lateral TSV die though at least one TSV;
    disposing a first package-on-package (POP) bond pad on the die side;
    disposing a first POP package on the die side in contact with the first POP bond pad;
    disposing a subsequent POP bond pad on the die side; and
    disposing a subsequent POP package on the die side in contact with the subsequent POP bond pad.

29. The process of claim 1, wherein the TSV die is a first TSV die that is partially embedded in the coreless substrate, and further comprising:
    disposing at least one package-on-package (POP) bond pad on the die side;
    partially embedding a first lateral-stack TSV die in the coreless substrate;
    disposing a subsequent lateral-stack die above the die side and coupled to the first lateral-stack TSV die through at least one TSV; and
    disposing a subsequent die disposed above the die side coupled to the first TSV die though at least one TSV.

30. The process of claim 1, wherein the TSV die is a first TSV die that is partially embedded in the coreless substrate, and further comprising:
    disposing at least one package-on-package (POP) bond pad on the die side
    contacting a second TSV die with the first TSV die;
    disposing a subsequent TSV die above the die side and coupled to the second TSV die through at least one TSV;
    partially embedding a first lateral-stack TSV die in the coreless substrate;
    contacting a second lateral-stack TSV die with the first lateral-stack TSV die;
    contacting a third lateral-stack TSV die with the second lateral-stack TSV die; and
    disposing a subsequent lateral-stack die above the die side coupled to the third lateral-stack TSV die through at least one TSV.

31. The process of claim 1, wherein the TSV die is a first TSV die that is partially embedded in the coreless substrate, and further comprising:
    partially embedding a first lateral TSV die in the coreless substrate; and
    disposing a subsequent die above the die side coupled to the TSV die though at least one TSV.

32. The process of claim 1, further including coupling at least one wire-bond die to the at least one TSV with a bond wire.

* * * * *